US010975474B2

United States Patent
Wendeln et al.

(10) Patent No.: US 10,975,474 B2
(45) Date of Patent: Apr. 13, 2021

(54) PROCESS FOR DEPOSITING A METAL OR METAL ALLOY ON A SURFACE OF A SUBSTRATE INCLUDING ITS ACTIVATION

(71) Applicant: Atotech Deutschland GmbH, Berlin (DE)

(72) Inventors: Christian Wendeln, Berlin (DE); Lutz Stamp, Berlin (DE); Bexy Dosse, Berlin (DE); Kay Wurdinger, Berlin (DE); Gerson Krilles, Berlin (DE); Tang Cam Lai Nguyen, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 49 days.

(21) Appl. No.: 16/092,459

(22) PCT Filed: May 4, 2017

(86) PCT No.: PCT/EP2017/060665
§ 371 (c)(1),
(2) Date: Oct. 10, 2018

(87) PCT Pub. No.: WO2017/191260
PCT Pub. Date: Nov. 9, 2017

(65) Prior Publication Data
US 2019/0169751 A1 Jun. 6, 2019

(30) Foreign Application Priority Data
May 4, 2016 (EP) .................................... 16168347

(51) Int. Cl.
| | | |
|---|---|---|
| *C23C 18/40* | (2006.01) | |
| *C23C 18/18* | (2006.01) | |
| *C23C 18/30* | (2006.01) | |
| *C23C 18/20* | (2006.01) | |
| C23C 18/24 | (2006.01) | |
| C23C 18/16 | (2006.01) | |
| B05D 5/12 | (2006.01) | |
| H05K 3/12 | (2006.01) | |

(52) U.S. Cl.
CPC .......... *C23C 18/40* (2013.01); *C23C 18/1844* (2013.01); *C23C 18/2066* (2013.01); *C23C 18/30* (2013.01); *B05D 5/12* (2013.01); *B05D 2350/00* (2013.01); *C23C 18/1692* (2013.01); *C23C 18/1893* (2013.01); *C23C 18/24* (2013.01); *H05K 3/1208* (2013.01)

(58) Field of Classification Search
USPC ....................................................... 427/99.1
See application file for complete search history.

(56) References Cited

U.S. PATENT DOCUMENTS

| | | | |
|---|---|---|---|
| 3,653,947 A * | 4/1972 | Kandler | ................ C23C 18/208 427/306 |
| 3,769,061 A | 10/1973 | Dutkewych et al. | |
| 3,898,136 A | 8/1975 | Yonemitsu et al. | |
| 4,520,052 A | 5/1985 | Showronek et al. | |
| 4,617,205 A | 10/1986 | Darken | |
| 4,629,636 A | 12/1986 | Courduvelis et al. | |
| 4,775,557 A | 10/1988 | Bastenbeck et al. | |
| 4,908,242 A * | 3/1990 | Hughes | ............... C23C 18/1617 106/1.23 |
| 5,753,309 A * | 5/1998 | Fakler | .................... B05D 3/102 427/399 |
| 6,861,097 B1 * | 3/2005 | Goosey | .................. H05K 3/181 427/304 |
| 7,220,296 B1 | 5/2007 | Chowdhury et al. | |
| 9,538,665 B2 | 1/2017 | Bastenbeck et al. | |
| 10,487,404 B2 | 11/2019 | Liu et al. | |
| 2005/0161338 A1 | 7/2005 | Fang et al. | |
| 2007/0167857 A1 | 7/2007 | Causevic | |

(Continued)

FOREIGN PATENT DOCUMENTS

| | | |
|---|---|---|
| CN | 104862677 A | 8/2015 |
| CN | 104928658 A | 9/2015 |

(Continued)

OTHER PUBLICATIONS

G. O. Mallory, J. B. Hajdu, Electroless Plating: Fundamentals and Applications, Reprint Edition, American Electroplaters and Surface Finishers Society, pp. 289-295.
PCT/EP2017/060665; PCT International Search Report and Written Opinion of the International Searching Authority dated Jun. 21, 2017.
Office Action for corresponding Chinese Application No. 201780025695.0 dated Jul. 21, 2020.
Search Report for corresponding Taiwanese Application No. 106114766 dated Apr. 23, 2020.

* cited by examiner

*Primary Examiner* — Brian K Talbot
(74) *Attorney, Agent, or Firm* — Renner, Otto, Boisselle & Sklar, LLP

(57) ABSTRACT

A process for depositing metal or metal alloy on a substrate including treating the substrate surface with an activation solution comprising a source of metal ions so the metal ions are adsorbed on the substrate surface, treating the obtained substrate surface with a treatment solution containing an additive selected from thiols, thioethers, disulphides and sulphur containing heterocycles, and a reducing agent suitable to reduce the metal ions adsorbed on the substrate surface selected from boron based reducing agents, hypophosphite ions, hydrazine and hydrazine derivatives, ascorbic acid, iso-ascorbic acid, sources of formaldehyde, glyoxylic acid, sources of glyoxylic acid, glycolic acid, formic acid, sugars, and salts of aforementioned acids; and subsequently treating the substrate surface with a metallizing solution comprising a source of metal ions to be deposited such that a metal or metal alloy is deposited thereon.

20 Claims, No Drawings

(56) References Cited

U.S. PATENT DOCUMENTS

| | | | |
|---|---|---|---|
| 2008/0038450 A1 | 2/2008 | Poole et al. | |
| 2008/0223253 A1 | 9/2008 | Song et al. | |
| 2009/0092757 A1 | 4/2009 | Satou et al. | |
| 2009/0123642 A1* | 5/2009 | Sato | C08G 59/5086 427/98.5 |
| 2012/0213914 A1 | 8/2012 | Ivanov et al. | |
| 2014/0209476 A1 | 7/2014 | Zhou et al. | |
| 2014/0242264 A1 | 8/2014 | Stenhauser et al. | |
| 2014/0255600 A1* | 9/2014 | Bastenbeck | C23C 18/2086 427/123 |
| 2014/0377471 A1 | 12/2014 | Bera et al. | |
| 2015/0017331 A1* | 1/2015 | Middeke | C23C 18/22 427/304 |
| 2015/0110965 A1 | 4/2015 | Brunner et al. | |
| 2015/0159274 A1 | 6/2015 | Fels et al. | |
| 2015/0299883 A1 | 10/2015 | Brunner et al. | |
| 2016/0053379 A1* | 2/2016 | Bruning | C23C 18/40 427/64 |
| 2016/0237571 A1 | 8/2016 | Liu et al. | |
| 2016/0348245 A1* | 12/2016 | Jin | C23C 18/1603 |
| 2017/0327954 A1 | 11/2017 | Brunner et al. | |
| 2018/0112320 A1 | 4/2018 | Brunner et al. | |

FOREIGN PATENT DOCUMENTS

| | | |
|---|---|---|
| DE | 3807618 | 9/1989 |
| DE | 3922477 | 1/1991 |
| DE | 4108461 | 6/1992 |
| EP | 1001052 | 5/2000 | ns
PROCESS FOR DEPOSITING A METAL OR METAL ALLOY ON A SURFACE OF A SUBSTRATE INCLUDING ITS ACTIVATION

The present application is a U.S. National Stage Application based on and claiming benefit and priority under 35 U.S.C. § 371 of International Application No. PCT/EP2017/060665, filed 4 May 2017, which in turn claims benefit of and priority to European Application No. 16168347.9 filed 4 May 2016, the entirety of both of which is hereby incorporated herein by reference.

FIELD OF THE INVENTION

This invention relates to a process for depositing a metal or metal alloy on a surface of a substrate including the required activation. It particularly relates to depositing a metal or metal alloy on printed circuit boards, IC substrates and the like including the activation step.

BACKGROUND OF THE INVENTION

Conventional printed circuit boards (PCBs) consist of laminated non-conductive dielectric substrates that rely on drilled and plated through holes (PTHs) to form a connection between the opposite sides and/or inner layers of a board. Electroless plating is a well-known process for preparing metallic coatings on surfaces. Electroless plating on a dielectric surface requires the prior deposition of a catalyst. The most commonly used method to catalyse or activate laminated non-conductive dielectric substrate regions, prior to electroless plating, is to treat the board with an aqueous tin-palladium colloid in an acidic chloride medium. The colloid consists of a metallic palladium core surrounded by a stabilizing layer of tin(II) ions. A shell of [SnCl$_3$]-complexes acts as surface stabilizing groups to avoid agglomeration of colloids in suspension.

In the activation process, the palladium-based colloid is adsorbed onto an insulating substrate such as epoxy or polyimide to activate electroless copper deposition. Theoretically, for electroless metal deposition, the catalyst particles play roles as carriers in the path of transfer of electrons from reducing agent to metal ions in the plating bath. Although the performance of an electroless copper process is influenced by many factors such as composition of the deposition solution and choice of ligand, the activation step is the key factor for controlling the initiation of electroless deposition. Palladium/tin colloid has been commercially used as an activator for electroless metal deposition for decades, and its structure has been extensively studied. Yet, its sensitivity to air and high cost leave room for improvement or substitution.

While the colloidal palladium catalyst has given good service, it has many shortcomings, which are becoming more and more pronounced as the quality of manufactured printed circuit boards increases. In recent years, along with the reduction in sizes and an increase in performance of electronic devices, the packaging density of electronic circuits has become higher and subsequently required to be defect free after electroless plating. As a result of greater demands on reliability, alternative catalyst compositions are required. The stability of the colloidal palladium catalyst is also a concern. As mentioned above, the palladium/tin colloid is stabilized by a layer of tin(II) ions and its counterions can prevent palladium from aggregating. The tin(II) ions easily oxidize to tin(IV) and thus the colloid cannot maintain its colloidal structure. This oxidation is promoted by increases in temperature and agitation. If the tin(II) concentration is allowed to fall close to zero, then palladium particles can grow in size, agglomerate, and precipitate.

As an alternative to the palladium-tin colloids, ionic metal activation has been used in the art, typically with palladium as metal. Ionic metal activation includes the treatment of a surface to be metallized with metal ions followed by the reduction of said ions on the surface with reducing agents such as dimethylamine borane (borane dimethylamine complex, DMAB). A major drawback of this method is the lack of efficiency of the reduction. A high excess of the reducing agent in relation to the metal ions is required in order to guarantee a sufficient activation prior to the metallization. Moreover, modules in production lines containing solutions with reducing agents are often polluted with residues from prior production cycles. Such polluted modules then require even higher excesses of reducing agent as the latter-named decompose even if no substrates are currently in the modules. This results inter alia in economic and ecological insufficiencies of the ionic metal activation. This renders the ionic metal activation less suitable for today's industrial processes, particularly for the manufacturing of printed circuit boards, IC substrates and the like.

EP 2 581 469 A1 concerns an activation solution for laser direct structured substrates comprising a reducing agent having a Nernst reduction potential $E^0$+0.35 V and a process for their use. Generally, the provision of a catalyst in the bulk of a material is not cost-efficient and further may result in problems when a structured metallisation is desired as the catalyst is then omnipresent and selective deposition of a metal (alloy) may be hampered. The deposition of a catalyst onto such a substrate containing the catalyst in the bulk of the material adds then even more to the cost which is undesired.

U.S. Pat. No. 5,753,309 A describes a method of bonding copper and a resin together wherein a copper oxide layer is reduced to metallic copper and the metallic copper is bonded to a resin, the improvement comprising reducing the copper oxide layer to metallic copper with an aqueous reducing solution containing a cyclic borane compound.

EP 2784181 publishes an electroless aqueous copper plating solution, comprising a source of copper ions, a reducing agent or a source of a reducing agent, and a combination, comprising i) at least one polyamino disuccinic acid, or at least one polyamino monosuccinic acid, or a mixture of at least one polyamino disuccinic acid and at least one polyamino monosuccinic acid, and ii) one or more of a compound which is selected from the group consisting of ethylenediamine tetraacetic acid, N'-(2-Hydroxyethyl)-ethylenediamine-N,N,N'-triacetic acid, and N,N,N',N'-Tetrakis (2-hydroxypropyl)ethylenediamine, as complexing agents.

OBJECTIVE OF THE PRESENT INVENTION

It is therefore the objective of the present invention to overcome the shortcomings of the prior art. It is a further objective of the present invention to provide a process for depositing a metal or metal alloy onto at least one portion of a surface of a substrate including the activation in a both economic and ecological manner.

It is yet another objective of the present invention to provide a process for the deposition of a metal or metal alloy onto at least one portion of a surface of a substrate including a step of ionic metal activation that requires a smaller excess of the reducing agent in relation to the metal ions without impairing the process results. Such process results include inter alia coverage of the surface with metal or metal alloy, colour, glossiness, conductivity and the adhesion to surface areas with metal or metal alloy from previous or subsequent process steps. It is still another objective of the present invention to provide a process wherein during the ionic metal activation a lower decomposition rate of the reducing agent is achieved.

SUMMARY OF THE INVENTION

Above-named objectives are solved by the process according to the invention for depositing a metal or metal alloy onto (at least one portion of) at least one surface of at least one substrate comprising the steps of
  (a) providing said substrate;
  (b) treating the surface of said substrate with an activation solution comprising at least one source of metal ions selected from the group consisting of sources of ruthenium ions, sources of rhodium ions, sources of palladium ions, sources of osmium ions, sources of iridium ions, sources of platinum ions, sources of copper ions, sources of silver ions, sources of nickel ions, sources of cobalt ions, sources of gold ions and mixtures thereof such that at least one portion of said metal ions is being adsorbed on the surface of said substrate;
  (c) treating the surface of said substrate obtained from step (b) with a treatment solution comprising i) at least one additive selected from the group consisting of thiols, thioethers, disulphides and sulphur containing heterocycles, and ii) at least one reducing agent suitable to reduce the metal ions adsorbed on the surface of said substrate selected from the group consisting of boron based reducing agents, sources of hypophosphite ions, hydrazine and hydrazine derivatives, ascorbic acid, iso-ascorbic acid, sources of formaldehyde, glyoxylic acid, sources of glyoxylic acid, glycolic acid, formic acid, sugars, and salts of aforementioned acids; and
  (d) treating the surface obtained from step (c) of said substrate with a metallizing solution comprising a solvent and at least one source of metal ions to be deposited such that a metal or metal alloy is deposited thereon.

The steps of the process according to the invention are carried out in the above-given order. Step (b) in combination with step (c) herein is referred to as "ionic metal activation".

DETAILED DESCRIPTION OF THE INVENTION

Percentages throughout this specification are weight-percentages (wt.-%) unless stated otherwise. Yields are given as percentage of the theoretical yield. Concentrations given in this specification refer to the volume or mass of the entire solutions unless stated otherwise.

Substrates

In step (a) of the process according to the invention, the at least one substrate is provided. The substrate comprises at least one surface. Typically, the substrate comprises at least one surface selected from the group consisting of metallic surfaces, non-metallic surfaces and combinations thereof. Combinations of metallic surfaces and non-metallic surfaces can be found for example in printed circuit boards when they are positioned adjacent to each other.

Metallic surfaces are preferably selected from copper, tungsten, tantalum, nickel, cobalt, gold as well as alloys and mixtures of the aforementioned. Said preferred metals, alloys and mixtures of the aforementioned are widely used in the electronics industry. More preferred are copper and copper alloys because their superior conductivity makes them particularly useful in the electronics industry.

Non-metallic surfaces are preferably selected from glass, silicon, resins and plastics, as well as mixtures and blends thereof.

Resins and plastics include dielectric materials typically used in the electronics industry and materials typically used in the manufacturing of household goods which are to be metallized.

Resins and plastics are preferably selected from epoxy, polyester such as polyethylene terephthalate (PET), polyimide (PI), polytetrafluoroethylene, acrylonitrile-butadiene-styrene copolymer (ABS copolymer), polyamide (PA), polycarbonate (PC) as well as mixtures and blends of the aforementioned.

Suitable glass is preferably selected from borosilicate glass, quartz glass, silica glass, fluorinated glass. Silicon preferably includes polysilicon (including doped polysilicon such as p-doped polysilicon and n-doped polysilicon) and monocrystalline silicon, silicon oxide, silicon nitride as well as silicon oxynitride.

The substrates are made in their entirety of any of the listed materials or combinations thereof or they only comprise surfaces made of one or more of the materials listed (above).

More preferably, the process according to the invention is directed to the manufacturing of printed circuit boards, IC substrates and the like and, accordingly, the substrate is more preferably selected from the group consisting of printed circuit boards, printed circuit foils, interposers, chip carriers, IC substrates, semiconductor wafers (semiconductor substrates), circuit carriers, interconnect devices and precursors for any of the aforementioned. Such precursors include inter alia FR-1, FR-2, FR-3, FR-4, FR-5, copper clads and laminates thereof.

Even more preferably, the process according to the invention is directed to the so-called plating through holes process and is particularly aimed at forming a metal layer on such non-metallic surfaces. Hence, even more preferably the substrate is selected from the group consisting of printed circuit boards, printed circuit foils, interposers, chip carriers, IC substrates, semiconductor wafers (semiconductor substrates), circuit carriers and interconnect devices, each comprising at least one recessed structure. Such recessed structures are preferably selected from the group consisting of trenches, blind micro vias (BMV), through hole vias (THV), through glass vias (TGV), through silicon vias (TSV), buried vias (or those vias which are to become such buried vias during later stages of the manufacturing process) and mixtures of the any of the aforementioned. Mostly, such substrate comprises a plurality of said recessed structures. By choosing said substrates in the process according to the invention, the named recessed structures are particularly preferably used as surfaces in the process according to the invention.

Optional Pre-Treatment

The process optionally comprises a further step (a.i) to be carried out between steps (a) and (b)
  (a.i) pre-treating said substrate.

Preferably, step (a.i) is carried out between steps (a) and (b). Suitable pre-treatment steps are known in the art and exemplarily described hereinafter. It is known to those skilled in the art that substrates sometimes are contaminated with residues from processing, human contact or the environment including such residues as for example grease, fat or wax residues. Said residues may be detrimental to the metal or metal alloy deposition in step (d) and/or the adsorption of metal ions in step (b) of the process according to the invention. Therefore, commonly one or more pre-treatment steps are advantageous in those cases in order to obtain optimal results. These pre-treatment steps are known in the art and sometimes referred to as cleaning, etching, reducing, or sweller steps.

Cleaning steps usually use aqueous solutions, which may be acidic, neutral or alkaline, and which optionally comprise surfactants and/or co-solvents such as glycols or glycol ethers to remove above-named residues from the surface of the substrate. The process according to the invention optionally comprises cleaning steps between any of the named steps (a) to (d) or optionally (e).

Sometimes, an etching step is included in the pre-treatment of the substrate to increase its surface area and/or to remove oxides therefrom. This is commonly accomplished by treating the substrate with an aqueous solution comprising strong acids like sulphuric acid and/or oxidation agents like hydrogen peroxide and/or persulphate.

Plastic substrates often—but not always—require to be treated with an oxidative treatment prior to activation. These methods are well known in the art and also referred to as "etching". Examples for such treatments include etching with acidic or alkaline solutions comprising further oxidations agents such as chromic acid, sulphuric acid, hydrogen peroxide, permanganate, periodate, bismuthate, halogen oxo compounds such as chlorite, chlorous, chlorate, perchlorate, the respective salts thereof or the respective bromine and iodine derivatives. Examples for such etching treatments are disclosed for example in EP 2 009 142 B1, EP 1 001 052 A2 and U.S. Pat. No. 4,629,636. Typically, such a treatment is followed by a reducing step comprising a treatment with an aqueous solution containing a reducing agent such as sodium hypophosphite or hydroxylamine.

Also, recessed structures present in and on substrates are often subjected to an oxidative etching step, typically with aqueous alkaline permanganate solutions in order to remove residues from drilling and the like which may be followed by a further reducing step. Said reducing step typically employs an aqueous solution comprising one a more reducing agents suitable to reducing manganese dioxide to water-soluble manganese compounds, e.g. hydrogen peroxide or sodium hypophosphite.

Plastic substrates and printed circuit boards, printed circuit foils, interposers, chip carriers, IC substrates, semiconductor wafers (semiconductor substrates), circuit carriers and interconnect devices, each comprising at least one recessed structure are preferably treated with a sweller (sweller step). Such swellers are known in the art and are exemplarily glycol ethers such as diethylene glycol dimethyl ether (DE-39 22 477 A1, U.S. Pat. No. 4,775,557) or ethylene glycol monomethyl ether (FR-A-22 22 459), solvents such as N-Methylpyrrolidone, dimethyl formamide (DE-38 07 618 A1), dimethyl sulfoxide or carbonates such as alkylene carbonates (DE 22 22 941 A1, DE 4108461 C1).

It is also possible within the scope of the present invention to combine any of the aforementioned steps in order to obtain pre-treated substrates. It is also possible to include further rinsing steps before, between or after these pre-treatment steps. The combination of a sweller step, an oxidative etching step and a reducing step is often referred to as "desmear" treatment. Such desmear treatment is particularly useful when treating recessed structures in electronic substrates making them particularly receptive for subsequent steps such as activation and metal deposition.

Optional Pre-Dip

Preferably, the process according to the invention comprises the further step (a.ii) treating (at least one portion of) the surface of the substrate with a pre-dip.

Step (a.ii) is carried out between steps (a) and (b) of the process according to the invention. If the process according to the invention comprises both steps (a.i) and (a.ii), then step (a.i) precedes step (a.ii). Such step is referred to herein as "pre-dip step".

The pre-dip step advantageously improves the adsorption of the metal ions present in the activation on the surface of the substrate. Thence, lower concentrations of the metal ions can be used, rendering the process then more ecologically and economically benign. Moreover, the pre-dip protects the activation solution in step (b) from pollution by impurities and improves the lifetime of the activation solution by continuous drag in (of the pre-dip) into the bath.

Pre-dip steps are known in the art. The person skilled in the art is aware of different chemistries to address the matter. Typically, pre-dips are aqueous solutions comprising amine containing compounds such as alkylamines, polyalkylene amines, nitrogen containing heterocycles and carboxyl, hydroxy and amino derivatives thereof.

Step (b): Activation

In step (b) of the process according to the invention, (at least one portion of) the at least one surface of the substrate is treated with an activation solution comprising at least one source of metal ions. The source of metal ions is selected from the group consisting of sources of ruthenium ions, sources of rhodium ions, sources of palladium ions, sources of osmium ions, sources of iridium ions, sources of platinum ions, sources of copper ions, sources of silver ions, sources of nickel ions, sources of cobalt ions, sources of gold ions and mixtures thereof. By treating the surface of the substrate with the activation solution, at least one portion of said metal ions is being adsorbed on the surface of said substrate.

Sources of metal ions which are preferably used are water-soluble salts and/or water-soluble complexes of above-named metals. Such salts and complexes are known to the person skilled in the art. Among others, such salts include the respective halides (such as fluorides, chlorides, bromides, iodides), nitrates, sulphates, alkylsulphonates, arylsulphonates, tosylates, triflates, salts of carboxylic acids (such as acetates and trifluoroacetate, thiosulphates), carbonates, bicarbonates, cyanides, oxides, hydroxides or complex salts such as hydrates, or those complex salts with metal or pseudo metal ions such ammonium chlorides of said metals or any combinations of any of the aforementioned.

Silver salts are preferably selected from the group consisting of silver nitrate, silver acetate, silver trifluoroacetate, silver tosylate, silver triflate, silver fluoride, silver sodium thiosulfate and silver potassium cyanide. Palladium salts are preferably selected from the group consisting of palladium chloride, palladium acetate, palladium potassium chloride, palladium sodium chloride, sodium tetrachloropalladate and palladium nitrate. Gold salts are preferably selected from the group consisting of gold cyanide, gold trichloride, gold tribromide, potassium gold chloride, potassium gold cyanide, sodium gold chloride and sodium gold cyanide. Platinum salts are preferably selected from the group consisting of platinum chloride and platinum sulphate. Copper salts are preferably selected from the group consisting of copper sulphate, copper chloride, copper nitrate, copper acetate and copper methane sulphonate. Nickel salts are preferably selected from the group consisting of nickel chloride, nickel acetate, nickel methanesulphonate, nickel carbonate and nickel sulphate. Cobalt salts are preferably selected from the group consisting of cobalt acetate, cobalt sulphate, cobalt chloride, cobalt bromide and cobalt ammonium sulphate. Preferably, oxides of the aforementioned metals are not used due to their low solubility.

Preferably, the at least one source of metal ions is selected from sources of copper ions, sources of cobalt ions, sources of nickel ions, sources of silver ions, sources of palladium ions, sources of gold ions and mixtures thereof. More preferably, the at least one source of metal ions is selected from the group consisting of sources of silver ions, sources of palladium ions and mixtures thereof. Most preferably, the at least one sources of metal ions is a source of palladium ions. These increased preferences are due to the increasing catalytic capability of the named metal ions (or the metals obtained therefrom) to activate the metallization in step (d).

The concentration of metal ions in the activation solution depends inter alia on the chosen metal ion. Generally, the (total) concentration of the metal ions in the activation solution preferably ranges from 1 to 1000 mg/kg, more preferably from 10 to 500 mg/kg, even more preferably from 50 to 300 mg/kg. Concentrations below said thresholds in some cases are not sufficient or require too long treatment times while concentrations above said ranges while being still effective are not economical because of the high prices of many of the metal used. The activation solution optionally comprises at least one complexing agent (sometimes referred to as chelating agent). This at least one complexing agent is suitable to prevent the precipitation of the metal ions in the activation solution and may enhance the adsorption of the metal on the substrate surface. The person skilled in the art knows which complexing agents to choose for the given source of metal ions or useful complexing agents can be identified in routine experiments. Generally, useful complexing agents are carboxylic acids including dicarboxylic acids and homologues thereof such as malic acid, hydroxyl carboxylic acids such as citric acid and tartaric acid, amino carboxylic acids such as glycine or EDTA, phosphonates and amines including aliphatic amines such as ethylene diamine or nitrogen containing heterocycles like pyrrole, imidazole, pyridine, pyrimidine and carboxyl, hydroxy and amino derivatives of amines.

The activation solution optionally comprises at least one surfactant (also referred to as wetting agents in the art). The at least one surfactant is non-ionic, cationic, anionic or amphoteric. A useful surfactant is selected in dependence of the substrate to be treated and the metal ions present in the activation solution. Such a surfactant can be identified by routine experiments. The activation solution is preferably free of reducing agents suitable to reduce the metal ions (e.g. to their metallic state). Such reducing agents in the activation solution will disadvantageously reduce the metal ions to their metallic state forming undesirable precipitates. Free of reducing agents shall mean that the activation solution is substantially free of said compounds. For example, this is understood as less than 1 wt.-%, preferably 0.1 wt.-%, more preferably 0.01 wt.-% of such reducing agents.

The activation solution is an aqueous solution. Optionally, the activation solution comprises water and a further solvent which is miscible with water such as alcohols, glycols or glycol ethers in order to improve the solubility of components dissolved therein. Preferably, the activation solution comprises more than 90 wt.-% water based on all solvents present in the activation solution, more preferably more than 99 wt.-% water, due to its ecologically benign character.

The activation solution preferably is neutral to alkaline. More preferably, the activation solution has a pH value of 7 or higher, even more preferably, the activation solution has a pH ranging from 9 to 13 and yet even more preferably, the activation solution has a pH ranging from 10 to 12. These pH ranges represent improved stability of the activation solution. The pH value is adjusted if necessary by acids and/or bases. Any acid and/or base may be used including hydrochloric acid, sulphuric acid, methane sulphonic acid, alkaline hydroxide, ammonium hydroxide, ammonia and the like.

The temperature of the activation solution during the treatment in step (b) is not particularly limited. Preferably, it ranges from 20 to 60° C., more preferably from 30 to 50° C., even more preferably from 35 to 45° C. Too high temperatures may result in a too high desorption of the metal ions from the surface while the activation solution may not be active enough at too low temperatures.

The duration (i.e. the treatment time) of the treatment in step (b) is not particularly limited. Preferably, the duration of the treatment ranges from 1 second to 10 minutes, more preferably from 10 seconds to 5 minutes and even more preferably from 30 seconds to 2 minutes.

The amount of metal ions being adsorbed on the surface of the substrate depends on various parameters such as the temperature of the activation solution, the duration of the treatment, the type and morphology of the surface of the substrate, the concentration of metal ions in the activation solution, the type and amount of complexing agents therein and the metal ions themselves. Generally, it is desired that at least 1 mg of metal ions per $m^2$ of surface of the substrate is being adsorbed on said surface. Preferably, 10 or more $mg/m^2$, more preferably 20 $mg/m^2$ are being adsorbed on the surface.

The term "adsorbed" is to be understood in a broad sense in the context of the present application. Any form of attachment of the metal ions on the surface shall be subsumed under this term being it a chemical, physical or any other form of attachment or residing of the metal ions on the surface. The metal ions remain on the surface of the substrate after the treatment with the activation solution.

It is also not crucial how the metal ions are present on the surface of the substrate. They may be present as individual ions (or e.g. as hydrates or the like), salts, clusters, in a metallic or any other form.

After step (b), the substrate is preferably rinsed, for example with deionised water, in order to prevent metal ions or complexing agent not absorbed on the surface of the substrate to be dragged over into any of the subsequent solutions.

Step (c): Reduction Step

In step (c) of the process according to invention, (at least one portion of) the surface of the substrate obtained from step (b) is treated with a treatment solution. Said treatment solution comprises i) at least one additive selected from the group consisting of thiols, thioethers, disulphides and sulphur containing heterocycles; and ii) at least one reducing agent suitable to reduce the metal ions adsorbed on the surface of said substrate selected from the group consisting of boron based reducing agents, sources of hypophosphite ions, hydrazine and hydrazine derivatives, ascorbic acid, iso-ascorbic acid, sources of formaldehyde, glyoxylic acid, sources of glyoxylic acid, glycolic acid, formic acid, sugars, and salts of aforementioned acids.

By treating (at least one portion of) the surface of the substrate obtained from step (b), at least one portion of the metal ions adsorbed thereon is reduced, preferably to the respective metallic state. Step (c) is herein referred to as "reduction step".

As outlined above, a large excess of reducing agent in relation to the metal ions is required in order to guarantee a sufficient activation prior to the metallization in conventional prior art processes. A part of the reducing agent is required to reduce the metal ions adsorbed on the surface of said substrate is reduced, preferably to their respective metallic state. Another part of the reducing agent is unfavourably decomposed without any positive effect such as reducing of the metal ions absorbed on the surface of the substrate. This undesired decomposition may be promoted by the metal (ions). The at least one additive selected from thiols, thioethers, disulphides and sulphur containing heterocycles advantageously reduces the undesired decomposition of the reducing agent present in the treatment solution and thereby help to save costs and chemicals by reducing the required excess of reducing agent. These sulphur containing additives show superior results in the process according to the invention and using them allows for savings of the reducing agent, particularly when combined with boron based reducing agents, and especially with aminoboranes as reducing agents. Thiols are sometimes referred to as mercaptans in the art. The moiety "—S—" in a thioether is occasionally labelled "sulfane" or "sulphane".

In one embodiment, the treatment solution comprises more than one additive independently selected from thiols, thioethers, disulphides and sulphur containing heterocycles. For example, a thiol and a disulphide are selected as two additives in the treatment solution.

Preferably, the at least one additive is selected from thiols, thioethers and disulphides. More preferably, the at least one additive is a thioether. These preferred choices of additives result in particularly improved results of the process according to the invention such as good and reliable metal deposition in step (d) while also allowing for very reliable technical processes while dealing with so-called drag-in of metal ions from the activation solution used in step (b) or from involuntary dissolution of metal ions absorbed on the surface of the substrate into the treatment solution.

The additives selected from the group consisting of thiols, thioethers, disulphides and sulphur containing heterocycles are preferably contained in a total concentration of 0.1 µg/L to 1 g/L, more preferably from 1 µg/L to 300 mg/L, even more preferably from 10 µg/L to 100 mg/L, yet even more preferably of 50 µg/L to 10 mg/L.

x
Thiol
The thiols are preferably represented by the following formula (I)

$$R^1\text{—SH} \qquad (I)$$

wherein (each) $R^1$ is independently selected from the group consisting of
  substituted and unsubstituted aliphatic groups, preferably substituted and unsubstituted alkyl groups, more preferably substituted or unsubstituted C1-C12-alkyl groups, even more preferably substituted or unsubstituted C1-C8-alkyl groups, yet even more preferably substituted or unsubstituted C2-C4-alkyl groups;
  substituted and unsubstituted aryl groups, preferably substituted or unsubstituted C6-C10-aryl groups. More preferably, the aryl group is selected from the group consisting of phenyl, indene and naphthyl; it is even more preferably phenyl; and
  substituted and unsubstituted heteroaryl groups, preferably substituted or unsubstituted five- to ten-membered heteroaryl groups wherein the individual members forming the heteroaryl ring are selected from carbon and nitrogen with the proviso that at least one member is carbon and at least one member nitrogen or from carbon and oxygen with the proviso that at least one member is carbon and at least one member is oxygen or from carbon, nitrogen and oxygen with the proviso that at least one member is carbon, at least one member is nitrogen and at least one member is oxygen; more preferably the individual members forming the heteroaryl ring are selected from carbon and nitrogen with the proviso that at least one member is nitrogen. Even more preferably, the heteroaryl group is selected from the group consisting of pyridine, pyrazine, pyrimidine, pyridazine, 1,2,3-triazine, 1,2,4-triazine, 1,3,5-triazine, indolyl and benzimidazole.

The aliphatic groups or the alkyl groups or the aryl groups or the heteroaryl groups are preferably substituted by functional groups increasing the polarity (or the dipole moment) resulting in an increased water-solubility and/or by further thiol groups (—SH). In some cases, it is advantageous that such functional groups increasing the polarity also result in a higher boiling point of the respective thiol. A higher boiling point is advantageous as less substance is lost due to evaporation in step (c). Such polarity increasing functional groups are preferably selected from the group consisting of hydroxyl (—OH), carbonyl (—CHO), carboxyl, carboxylic esters (—CO$_2$R'), alkoxy (—O-alkyl), urea (—NH—C(O)—NH$_2$), amino (—NH$_2$); more preferably the polarity increasing functional groups are selected from the group consisting of hydroxyl and amino which are particularly effective. Additional thiol groups increase the overall effectiveness of the respective additives in the process according to the invention and allow for better savings of the reducing agent in step (c).

Most preferred, the thiol is selected from the group consisting of ethylthiol, 1-propylthiol, 2-propylthiol, 1-butylthiol, 2-butylthiol, 2-methylpropane-1-thiol, ethane-1,2-dithiol, propane-1,2-dithiol, propane-1,3-dithiol, butane-1,2-dithiol, butane-1,3-dithiol, butane-1,4-dithiol, butane-2,3-dithiol, 2-methylpropane-1,2-dithiol, 1H-benzo[d]imidazole-2-thiol, 1-methyl-1H-benzimidazole-2-thiol, 2-mercaptophenol, 4-mercaptophenol, thiosalicylic acid and 6-mercaptopyridine-3-carboxylic acid and the respective hydroxy and/or amino and/or carboxyl derivatives of the aforementioned such as cysteamine (2-aminoethanethiol), 2-mercaptoethan-1-ol, dimercaptoethane-1,2-diol, diaminoethane-1,2-dithiol and thioglycolic acid, 3-mercaptopropionic acid, 4-mercaptobutyric acid, cysteine, N-acetylcysteine, 3-mercapto-1-propanol, 1-mercapto-2-propanol, 4-mercapto-1-butanol and isomers, dithiothreitol (1,4-bis(sulfanyl)butane-2,3-diol). Generally, hydroxy and/or amino and/or carboxyl derivatives are obtained from a compound by (theoretically) substituting one or more hydrogen atoms from a carbon atom by one or more hydroxy and/or amino and/or carboxyl group, respectively. It is understood that it is possible within the means of the present invention that also combination of the above are included such as amino carboxyl derivatives where at least one hydrogen atom is (theoretically) substituted by an amino group and at least one hydrogen atom is (theoretically) substituted by a carboxyl group. This means that the derivatives are the possible hydroxyl-, amino- and/or carboxyl-functionalised compounds from the aforementioned.

The thiols represented by formula (I) are preferably contained in the treatment solution in a concentration ranging from 0.1 µg/L to 10 mg/L, more preferably in a concentration ranging from 1 µg/L to 1 mg/L, even more preferably in a concentration ranging from 10 µg/L to 300 µg/L.

Said concentration ranges allow for a significantly lower decomposition rate of the reducing agent in step (c) and thereby a smaller excess of the reducing agent in relation to the metal ions being adsorbed on the surface of the substrate while avoiding any deterioration of metal or metal alloy layer formed in step (d) such as incomplete coverage or decolouration.

Thioether

The thioethers are preferably represented by the following formula (II)

$$R^2-S-R^3 \qquad (II)$$

wherein $R^2$ and $R^3$ are independently from each other selected from the group consisting of
- substituted and unsubstituted aliphatic groups, preferably substituted and unsubstituted alkyl groups, more preferably substituted or unsubstituted C1-C12-alkyl groups, even more preferably substituted or unsubstituted C1-C8-alkyl groups, yet even more preferably substituted or unsubstituted C2-C4-alkyl groups;
- substituted and unsubstituted aryl groups, preferably substituted or unsubstituted C6-C10-aryl groups, more preferably selected from the group consisting of phenyl, indene and naphthyl, even more preferably phenyl;
- substituted and unsubstituted heteroaryl groups, preferably substituted or unsubstituted five- to ten-membered heteroaryl groups wherein the individual members forming the heteroaryl ring are selected from carbon and nitrogen with the proviso that at least one member is carbon and at least one member nitrogen or from carbon and oxygen with the proviso that at least one member is carbon and at least one member is oxygen or from carbon, nitrogen and oxygen with the proviso that at least one member is carbon, at least one member is nitrogen and at least one member is oxygen; more preferably the individual members forming the heteroaryl ring are selected from carbon and nitrogen with the proviso that at least one member is nitrogen. Even more preferably, the heteroaryl group is selected from the group consisting of pyridine, pyrazine, pyrimidine, pyridazine, 1,2,3-triazine, 1,2,4-triazine, 1,3,5-triazine, indolyl and benzimidazole.

The aliphatic groups and/or alkyl groups and/or the aryl groups and/or the heteroaryl groups of $R^2$ and/or $R^3$ in formula (II) are optionally substituted by at least one functional group increasing the polarity (or the dipole moment) resulting in an increased water-solubility and boiling point of the respective thioether and/or by further thiol groups (—SH) and/or thioether groups (—S-alkyl, —S-aryl, —S-heteroaryl). A higher boiling point is advantageous as less substance is lost due to evaporation in step (c). Such polarity increasing functional groups are preferably selected from the group consisting of hydroxyl, carbonyl, carboxyl, carboxylic esters, alkoxy, urea, amino; more preferably, the polarity increasing functional groups are selected from the group consisting of hydroxyl and amino which are particularly effective. Further thiol groups and/or thioether groups increase the overall effectiveness of the respective additives in the process according to the invention. It is therefore preferred that the thioether according to formula (II) comprises at least one additional thiol groups and/or thioether groups.

Most preferred, the thioether is selected from the group consisting of diethylsulphane, dipropylsulphane, dibutylsulphane, ethylproylsulphane, ethylbutylsulphane, propylbutylsulphane, 2-(methylthio)benzoic acid, 4,4'-thiodiphenol, and the respective hydroxy and/or amino and/or carboxyl derivatives thereof such as 2,2'-thiobis(ethan-1-ol), 2,2'-thiobis(ethan-1-amine), 2-(methylthio)ethan-1-amine, 4-(methylthio)aniline and 2-(methylthio)-1H-benzo[d]imidazole, methionine, 3,3'-thiodipropanol, 4,4'-thiodibutanol, 3,6-dithia-1,8-octanediol, 2-(methylthio)-1-ethanol, 3-(methylthio)-1-propanol, 2-(methylthio)ethylamine, 5-thio-D-glucose, 3,3'-thiodipropionic acid, 2,2'-(ethylenedithio)diacetic acid.

Generally, hydroxy and/or amino and/or carboxyl derivatives are obtained from a compound by (theoretically) substituting one or more hydrogen atoms from a carbon atom by one or more hydroxy and/or amino and/or carboxyl group, respectively. It is understood that it is possible within the means of the present invention that also combination of the above are included such as amino carboxyl derivatives where at least one hydrogen atom is (theoretically) substituted by an amino group and at least one hydrogen atom is (theoretically) substituted by a carboxyl group. This means that the derivatives are the possible hydroxyl-, amino- and/or carboxyl-functionalised compounds from the aforementioned.

The thioethers represented by formula (II) are preferably contained in the treatment solution in a concentration ranging from 1 µg/L to 1 g/L, more preferably in a concentration ranging from 0.05 mg/L to 200 mg/L, even more preferably in a concentration ranging from 1 mg/L to 100 mg/L.

In case where the thioether represented by formula (II) comprises at least one thiol group (—SH) and/or at least one disulphane group, the concentration of such thioether more preferably ranges ranging from 0.1 µg/L to 10 mg/L, more preferably in a concentration ranging from 1 µg/L to 1 mg/L, even more preferably in a concentration ranging from 10 µg/L to 300 µg/L due to the higher effectiveness of the such thioether.

Said concentration ranges allow for a significantly lower decomposition rates of the reducing agent in step (c) and thereby a smaller excess of the reducing agent in relation to the metal ions being adsorbed on the surface of the substrate while avoiding any deterioration of metal or metal alloy layer formed in step (d) such as incomplete coverage or decolouration.

Thioethers, especially those represented by formula (II), are particularly preferred as additives to be used in the treatment solutions in step (c) because of their surprisingly low adsorption tendency on the surfaces of the substrate. They are therefore less prone to drag-out compared to the other types of additives.

Disulphides

Disulphides comprise a "—S—S—"-moiety (group) with a single bond between the two sulphur atoms present therein. This moiety in the disulphide is also referred to "disulfane" or "disulphane".

The disulphides are preferably represented by the following formula (III)

$$R^4-S-S-R^5 \qquad (III)$$

wherein $R^4$ and $R^5$ are independently from each other selected from the group consisting of substituted and unsubstituted aliphatic groups, preferably substituted and unsubstituted alkyl groups, more preferably substituted or unsubstituted C1-C12-alkyl groups, even more preferably are substituted or unsubstituted C1-C8-alkyl groups, yet even more preferably substituted or unsubstituted C2-C4-alkyl groups resulting in a higher water solubility of the respective disulphide;

substituted and unsubstituted aryl groups, preferably substituted or unsubstituted C6-C10-aryl groups, more preferably selected from the group consisting of phenyl, indene and naphthyl, even more preferably phenyl;

substituted and unsubstituted heteroaryl groups, preferably substituted or unsubstituted five- to ten-membered heteroaryl groups wherein the individual members forming the heteroaryl ring are selected from carbon and nitrogen with the proviso that at least one member is carbon and at least one member nitrogen or from carbon and oxygen with the proviso that at least one member is carbon and at least one member is oxygen or from carbon, nitrogen and oxygen with the proviso that at least one member is carbon, at least one member is nitrogen and at least one member is oxygen; more preferably the individual members forming the heteroaryl ring are selected from carbon and nitrogen with the proviso that at least one member is nitrogen. Even more preferably, the heteroaryl group is selected from the group consisting of pyridine, pyrazine, pyrimidine, pyridazine, 1,2,3-triazine, 1,2,4-triazine, 1,3,5-triazine, indolyl and benzimidazole.

The aliphatic groups and/or alkyl groups and/or the aryl groups and/or the heteroaryl groups of $R^4$ and $R^5$ in formula (III) are optionally substituted by at least one functional group increasing the polarity (or the dipole moment) resulting in an increased water-solubility and boiling point of the respective disulphide for the reasons outlined above and/or by further thiol groups and/or thioether groups. Such polarity increasing functional groups are preferably selected from the group consisting of hydroxyl, carbonyl, carboxyl, carboxylic esters, alkoxy, urea, amino; more preferably, the polarity increasing functional groups are selected from the group consisting of hydroxyl and amino which are particularly effective. Further thiol groups and/or thioether groups increase the overall effectiveness of the respective additives in the process according to the invention. It is therefore preferred that the disulphide according to formula (III) comprises at least one additional thiol groups (—SH) and/or thioether groups.

Most preferred, the disulphide is selected from the group consisting of cystamine, 2-hydroxyethyl disulphide (2,2'-Dithiodiethanol), 3-hydroxypropyldisulphide, 4-hydroxybutyldisulphide, dithiodiglycolic acid, 3,3'-dithiodipropionic acid, 4,4'-dithiodibutyric acid, bis(2-aminophenyl) disulphide, bis(4-aminophenyl) disulphide, 2,2'-dithiodibenzoic acid, difurfuryl disulphide, D-penicillamine disulphide, 3,3'-dihydroxydiphenyl disulphide, methyl furfuryl disulphide, 1,2-bis(2,2-diethoxyethyl)disulphide, 2,2'-dithiodipyridine, and 6,6'-dithiodinicotinic acid.

The disulphides represented by formula (III) are preferably contained in the treatment solution in a concentration ranging from 0.1 µg/L to 10 mg/L, more preferably in a concentration ranging from 1 µg/L to 1 mg/L, even more preferably in a concentration ranging from 10 µg/L to 300 µg/L.

Said concentration ranges allow for a significantly lower decomposition rate of the reducing agent in step (c) and thereby a smaller excess of the reducing agent in relation to the metal ions being adsorbed on the surface of the substrate while avoiding any deterioration of metal or metal alloy layer formed in step (d) such as incomplete coverage or decolouration.

Sulphur Containing Heterocycle

Any sulphur containing heterocycle can be used in the treatment solution of the process according to the invention.

Preferably, the sulphur containing heterocycles independently comprise at least one ring-system, preferably one, which comprises carbon atoms, at least one sulphur atom and optionally at least one nitrogen atom, wherein the total amount of said carbon, sulphur and nitrogen atoms in the at least one ring-system ranges from 3 to 13 atoms, preferably from 4 to 12, more preferably from 5 to 9;

and wherein the sulphur containing heterocycles are substituted or unsubstituted; and the sulphur containing heterocycles are saturated or unsaturated, preferably aromatic.

It is preferred that the sulphur atoms in the at least one ring-system of the sulphur containing heterocycles do not bind to any oxygen; therefore, sulphoxides (—S(O)—) and sulphone (—S(O)$_2$—) derived heterocycles are less preferred as they are not very efficient as additives in the process according to the invention. Further, cyclic sulphates or sulphites (having an endocyclic "—S(O)—O-"group or a "—S—O-"group) are less preferred for the same reason. It is more preferred that the sulphur atoms in the at least one ring-system of the sulphur containing heterocycles are not bound to any other than the atoms of the at least one ring-system (which are selected from carbon atoms, sulphur atoms and optionally nitrogen atoms).

In some cases, the at least one ring-system of the sulphur containing heterocycles optionally comprises at least one oxygen atom which is not (directly) bound to a sulphur atom of the at least one ring-system. In most cases, the at least one ring-system of the sulphur containing heterocycles consists of carbon atoms, sulphur atoms and optionally nitrogen atoms and is thus free of oxygen atoms.

More preferably, the at least one ring-system of the sulphur containing heterocycles comprises 1 or 2 sulphur atoms and 0, 1 or 2 nitrogen atoms (with the balance to above-defined ranges being carbon atoms). Even more preferably, the at least one ring-system of the sulphur containing heterocycles comprise 1 or 2 nitrogen atoms because the efficiency of the decrease of the decomposition rate of the reducing agent is then more pronounced (see examples in Table V).

The sulphur containing heterocycles preferably comprise only one ring system which comprises carbon atoms, at least one sulphur atom and optionally at least one nitrogen atom. If more than one such ring-system is contained in the sulphur containing heterocycles the decrease of the decomposition rate of the reducing agent in step (c) is less pronounced (see examples in Table V).

The sulphur containing heterocycles are either substituted or unsubstituted. Substituted sulphur containing heterocycles may theoretically be obtained by replacing at least one hydrogen atom by a functional group. Such functional groups are preferably selected from amino, hydroxyl, carbonyl, carboxyl, carboxylic esters, alkoxy, urea, halides, alkyl groups, aryl groups, thiol, thioalkyl, thioaryl and thioheteroaryl.

Preferred functional groups are selected from sulphur containing functional groups such as thiol, thioalkyl, thioaryl and thioheteroaryl and functional groups increasing the water-solubility of the respective sulphur containing heterocycle. Such preferred functional groups include hydroxyl, carbonyl, carboxyl, carboxylic esters, alkoxy, urea, thiol, amino, thioalkyl, thioaryl and thioheteroaryl; more preferred hydroxyl, amino, thiol, thioalkyl, thioaryl and thioheteroaryl. Sulphur containing functional groups increase the effectiveness of the additive in terms of saving of the reducing agent in step (c) and it therefore preferred that the sulphur containing heterocycles comprise at least one additional thiol, thioalkyl, thioaryl and/or thioheteroaryl (see examples in Table V).

The sulphur containing heterocycles are saturated, unsaturated or aromatic. Saturated sulphur containing heterocycles are preferably selected from thiirane, thietane, diethietane, thiolane, thiozolidine, isothiazolidine, thiane, thiomorpholine, trithiane, thioipane, thiocane, thionane and fused rings derived from any of the aforementioned. Unsaturated sulphur containing heterocycles preferably selected from thiete, diethiete, thiadiazole, thiopyran, thiazine, thiepine, dihydrothiepine, thiazepine, thiocine, thionine and fused rings derived from any of the aforementioned. Aromatic sulphur containing heterocycles are preferably selected from thiazole, thiophene, isothiazole and fused rings derived from any of the aforementioned such as benzothioazole, benzothiophene, benzo[d][1,3]dithiole and dibenzothiophene.

Preferably, the sulphur containing heterocycles are selected from unsubstituted and substituted thiopyran, unsubstituted and substituted benzothiazole, unsubstituted and substituted thiabendazole, unsubstituted and substituted thiazole, unsubstituted and substituted thiophene, unsubstituted and substituted tetrahydrothiophene, unsubstituted and substituted thiazolidine, unsubstituted and substituted 1,3-Dithiolane, unsubstituted and substituted 1,4-dithiane, unsubstituted and substituted 1,3-dithiane, unsubstituted and substituted thiomorpholine, unsubstituted and substituted tetrahydrothiopyran.

The substituted sulphur containing heterocycles of aforementioned group are preferably selected from 2-(hydroxymehyl)benzothiazole, thiazole-2-carboxylic acid, 2-(aminomethyl)thiazole, 2-propyl-1,3-thiazole, 2-methoxy-1,3-thiazole, 2-mercaptobenzothiazole, 4-phenylthiazole-2-thiol, 3,4-dimethoxythiophene, 3,4-ethylenedioxythiophene, 3,4-propylenedioxythiophene, tetrahydrothiopyran-4-ol and tetrahydrothiopyran-4-ylamine.

More preferably, the sulphur containing heterocycles are selected from unsubstituted and substituted, unsaturated and (even more preferably) aromatic sulphur containing heterocycle. Particularly preferred are the unsubstituted or substituted aromatic sulphur containing heterocycles as they show the highest efficiency in decreasing the decomposition of the reducing agent in step (c).

The sulphur containing heterocycles are preferably contained in the treatment solution in a concentration ranging from 0.1 µg/L to 500 mg/L, more preferably in a concentration ranging from 10 µg/L to 100 mg/L, even more preferably in a concentration ranging from 50 µg/L to 20 mg/L.

In case where the sulphur containing heterocycles comprise at least one thiol group (—SH) and/or at least one disulphane group, the concentration of such sulphur containing heterocycles more preferably ranges ranging from 0.1 µg/L to 10 mg/L, more preferably in a concentration ranging from 1 µg/L to 1 mg/L, even more preferably in a concentration ranging from 10 µg/L to 300 µg/L due to the higher effectiveness of the such sulphur containing heterocycles.

Said concentration ranges allow for a significantly lower decomposition rate of the reducing agent in step (c) and thereby a smaller excess of the reducing agent in relation to the metal ions being adsorbed on the surface of the substrate while avoiding any deterioration of metal or metal alloy layer formed in step (d) such as incomplete coverage or decolouration.

The additive in the treatment solution of step (c) has preferably a boiling point of at least the temperature of the treatment solution in step (c). This is to prevent a substantial loss of said additive due to evaporation during step (c). More preferably, the boiling point of the additive in the treatment solution of step (c) is at least 20° C., even more preferably at least 25° C., yet even more preferably at least 30° C. and most preferably at least 40° C. Boiling points given in this specification and in the claims refer to the boiling points obtained at 1013 mbar.

In one embodiment, the at least one additive is selected from the following group: The thiols are selected from the group consisting of ethylthiol, 1-propylthiol, 2-propylthiol, 1-butylthiol, 2-butylthiol, 2-methylpropane-1-thiol, ethane-1,2-dithiol, propane-1,2-dithiol, propane-1,3-dithiol, butane-1,2-dithiol, butane-1,3-dithiol, butane-1,4-dithiol, butane-2,3-dithiol, 2-methylpropane-1,2-dithiol, 1H-benzo[d]imidazole-2-thiol, 1-methyl-1H-benzimidazole-2-thiol, 2-mercaptophenol, 4-mercaptophenol, thiosalicylic acid and 6-mercaptopyridine-3-carboxylic acid and the respective hydroxy and/or amino and/or carboxyl derivatives of the aforementioned such as cysteamine (2-aminoethanethiol), 2-mercaptoethan-1-ol, dimercaptoethane-1,2-diol, diaminoethane-1,2-dithiol and thioglycolic acid, 3-mercaptopropionic acid, 4-mercaptobutyric acid, cysteine, N-acetylcysteine, 3-mercapto-1-propanol, 1-mercapto-2-propanol, 4-mercapto-1-butanol and isomers, dithiothreitol (1,4-bis (sulfanyl)butane-2,3-diol); the thioethers are selected from the group consisting of diethylsulphane, dipropylsulphane, dibutylsulphane, ethylproylsulphane, ethylbutylsulphane, propylbutylsulphane, 2-(methylthio)benzoic acid, 4,4'-thiodiphenol, and the respective hydroxy and/or amino and/or carboxyl derivatives of the aforementioned such as 2,2'-thiobis(ethan-1-ol), 2,2'-thiobis(ethan-1-amine), 2-(methylthio)ethan-1-amine, 4-(methylthio)aniline and 2-(methylthio)-1H-benzo[d]imidazole, methionine, 3,3'-thiodipropanol, 4,4'-thiodibutanol, 3,6-dithia-1,8-octanediol, 2-(methylthio)-1-ethanol, 3-(methylthio)-1-propanol, 2-(methylthio)ethylamine, 5-thio-D-glucose, 3,3'-thiodipropionic acid, 2,2'-(ethylenedithio)diacetic acid; the disulphides are selected from the group consisting of cystamine, 2-hydroxyethyl disulphide, 3-hydroxypropyldisulphide, 4-hydroxybutyldisulphide, dithiodiglycolic acid, 3,3'-dithiodipropionic acid, 4,4'-dithiodibutyric acid, bis(2-aminophenyl) disulphide, bis(4-aminophenyl) disulphide, 2,2'-dithiodibenzoic acid, difurfuryl disulphide, D-penicillamine disulphide, 3,3'-dihydroxydiphenyl disulphide, methyl furfuryl disulphide, 1,2-bis(2,2-diethoxyethyl)disulphide, 2,2'-dithiodipyridine and 6,6'-dithiodinicotinic acid; the sulphur containing heterocycles are selected from the group consisting of unsubstituted and substituted thiophene, unsubstituted and substituted thiazole, unsubstituted and substituted thiopyran, unsubstituted and substituted benzothiazole, unsubstituted and substituted thiabendazole, unsubstituted and substituted benzothiazole, unsubstituted and substituted thiazole, unsubstituted and substituted thiophene, unsubstituted and substituted tetrahydrothiophene, unsubstituted and substituted thiazolidine, unsubstituted and substituted 1,3-Dithiolane, unsubstituted and substituted 1,4-dithiane, unsubstituted and substituted 1,3-dithiane, unsubstituted and substituted thiomorpholine, unsubstituted and substituted tetrahydrothiopyran.

Definitions

The term "alkyl group" according to the present invention comprises branched or unbranched alkyl groups comprising cyclic and/or non-cyclic structural elements, wherein cyclic structural elements of the alkyl groups naturally require at least 3 carbon atoms. C1-CX-alkyl group in this specification and in the claims refers to alkyl groups having 1 to X carbon atoms (X being an integer). C1-C8-alkyl for example includes, among others, methyl, ethyl, n-propyl, iso-propyl, n-butyl, iso-butyl, sec-butyl, tert-butyl, n-pentyl, iso-pentyl, sec-pentyl, tert-pentyl, neo-pentyl, hexyl, heptyl and octyl. Substituted alkyl groups may theoretically be obtained by replacing at least one hydrogen by a functional group. Unless stated otherwise, alkyl groups are preferably selected from substituted or unsubstituted C1-C8 alkyl groups, more preferably from substituted or unsubstituted C1-C4 alkyl groups because of their improved water-solubility. The term "aliphatic group" includes alkyl groups and the respective unsaturated derivatives thereof (which include one or more double and/or triple bonds). The provisos described for the alkyl group in terms of substitution and chain length apply to aliphatic groups mutatis mutandis.

In so far as the term "aryl group" is used in this description and in the claims, it refers to ring-shaped aromatic hydrocarbon residue, for example phenyl or naphtyl. Furthermore, aryl groups are optionally substituted by replacing a hydrogen atom in each case by a functional group. The term C1-CX-aryl group refers to aryl groups having 1 to X carbon atoms in the ring-shaped aromatic group.

In so far as the term "heteroaryl group" is used in this description and in the claims, it refers to ring-shaped aromatic hydrocarbon residues where at least one nitrogen and/or oxygen atom replaces a carbon atom in said ring-shaped aromatic hydrocarbon residue, for example pyrrole and benzimidazole. Furthermore, heteroaryl groups are optionally substituted by replacing a hydrogen atom by a functional group.

Reducing Agent

The treatment solution further comprises at least one reducing agent which is suitable to reduce the metal ions adsorbed on the surface of the substrate, preferably to their respective metallic state. By reducing the metal ions adsorbed on the surface of the substrate, an island-like metal layer derived from said metal ions is typically formed on the surface of the substrate. This island-like metal layer is efficient in promoting the deposition of metals in step (d).

The at least one reducing agent is selected from the group consisting of boron based reducing agents, sources of hypophosphite ions, hydrazine and hydrazine derivatives, ascorbic acid, iso-ascorbic acid, sources of formaldehyde (including formaldehyde itself), sources of glyoxylic acid (including glyoxylic acid itself), glycolic acid, formic acid, sugars (including polysaccharides), and salts of aforementioned acids.

Typically, sources of hypophosphite are selected from the group consisting of alkaline hypophosphite, earth alkaline hypophosphite, ammonium hypophosphite and hypophosphorous acid. Sources of formaldehyde include formaldehyde itself but also para-formaldehyde and urotropin.

Preferably, boron based reducing agents are selected from the group consisting of amino boranes, ammonia borane, borohydrides (including alkaline borohydrides, cyanoborohydrides and alkylborohydrides), borane and homologues thereof (such as diborane and alkylboranes). More preferably, the at least one reducing agents are selected to be boron based reducing agents.

The at least one reducing agent most preferably are amino boranes selected from dimethyl aminoboranes (borane dimethylamine complex, DMAB), morpholine methylborane (borane trimethylamine complex) and tert-butyl aminoboranes (borane tert-butylamine complex). These reducing agents show superior results in reducing the metal ions adsorbed on the surface of the substrate and the process according to the invention and the least tendency to decompose in the process according to the invention. Further, said reducing agents are effective reducing agents and cost-efficient. Moreover, they are stable in water over a wide pH range.

Preferably, the total concentration of the at least one reducing agent ranges from 0.1 to 500 mmol/L, more preferably from 1 to 100 mmol/L, even more preferably from 2 to 40 mmol/L.

Preferably, the treatment solution is free of intentionally added reducible metal ions. Such reducible metal ions are those metal ions which can be reduced under the conditions given, in particular those described above to be present in the activation solution. Thus, the treatment solution is not a plating bath, and thus usually not able to deposit any metal or metal alloy.

The treatment solution is an aqueous solution. Optionally, the treatment solution comprises water and a further solvent which is miscible with water such as alcohols, glycols or glycol ethers in order to improve the solubility of components dissolved therein. Preferably, the treatment solution comprises more than 90 wt.-% water based on all solvents present in the treatment solution, more preferably more than 99 wt.-% water, due to its ecologically benign character.

The treatment solution preferably has a pH value ranging from 5 to 13. More preferably, the treatment solution has a pH value ranging from 6 to 11, even more preferably; the treatment solution has a pH ranging from 7 to 10.5. These preferred pH ranges show an increased ability of most reducing agents to reduce metal ions adsorbed on the surface of the substrate. However, the pH value is optionally adjusted depending on the reducing agent used. It is advantageous to keep the pH in above-defined ranges during the process as the decomposition of many of the reducing agents outside said ranges is accelerated. This can be accomplished by continuous or discontinuous addition of acids and/or bases.

The pH value is optionally adjusted by acids and/or bases. Any acid and/or base may be used including hydrochloric acid, acetic acid, boric acid, phthalic acid, sulphuric acid, methane sulphonic acid, alkaline hydroxide, ammonium hydroxide, ammonia and the like. In alkaline pH media of the treatment solution, thiol groups may be present (partially) as thiolate groups (—S$^-$) with a counter ion because of their weak acidity. Such counter ion typically is a metal ion or an ammonium cation depending on which base was used to adjust the pH value.

The temperature of the treatment solution during the treatment in step (c) is not particularly limited. Preferably, it ranges from 5 to 60° C., more preferably from 10 to 40° C., even more preferably from 15 to 35° C. and yet even more preferably from 20 to 30° C. Too high temperatures may result in an increase of the decomposition of reducing agent while too low temperatures might not be effective enough to reduce the metal ions adsorbed on the surface of the substrate. It was found by the inventors that when working in the more preferred temperature ranges, a significantly lower decomposition rate of the reducing agent in step (c) is achieved.

The duration of the treatment in step (c) is not particularly limited. Preferably, the duration of the treatment ranges from 1 second to 5 min, more preferably from 10 seconds to 4 min and even more preferably from 20 seconds to 60 seconds. While too short durations may not suffice to substantially reduce the metal ions adsorbed on the surface of the substrate, durations exceeding 5 min do not add significantly to the results anymore and only lengthen the overall process duration incurring additional cost.

Step (d): Metallization Step

In step (d), (at least one portion of) the surface obtained from step (c) of the substrate is treated with a metallizing solution. By treating the surface of the substrate with a metallizing solution, a metal or metal alloy is deposited thereon. Step (d) is herein referred to as "metallization step".

The metallizing solution (also referred to as plating bath) selected to be an electroless metallizing solution, an electrolytic metallizing solution or an immersion metallizing solution. Preferably, the metallizing solution is an electroless metallizing solution because this will most effectively form a metal or metal alloy layer on the surface obtained from step (c). Generally, metallizing solutions comprise a solvent, typically water, and at least one source of metal ions to be deposited. Further optional components are and complexing agents (or chelating agents) for said metal ions (e.g. those mentioned below), reducing agents for said metal ions, stabilizing agents, co-solvents, wetting agents and functional additives such as brighteners, accelerators, suppressors, anti-tarnish agents. Such metallizing solutions and components are known in the art. The metal ions to be deposited in the metallizing solution may be same as the metal ions in the activation solution or they may be different.

Contrary to electrolytic metal deposition methods using an external source of electrons, electroless processes are known for the formation of metallic films of many metals. Electroless plating is the controlled autocatalytic deposition of a continuous film of metal without the assistance of an external supply of electrons instead employing (chemical) reducing agents. In the context of the present invention, electroless plating is to be understood as autocatalytic deposition with the aid of a (chemical) reducing agent (referred to as "reducing agent" herein). A further form of metal deposition is immersion plating. Immersion plating is another deposition of metal without the assistance of an external supply of electrons and without chemical reducing agent. The mechanism relies on the substitution of metals from an underlying substrate for metal ions present in the immersion plating solution. In some cases, immersion and electroless plating occur simultaneously depending on the metal (alloy) to be deposited, the underlying substrate and the reducing agent in the solution. The terms "plating" and "deposition" are used interchangeably herein.

The main components of the electroless metallizing solution are at least one source of metal ions, at least one complexing agent, at least one reducing agent, and, optional ingredients such as stabilising agents, grain refiners and pH adjustors (acids, bases, buffers).

The at least one source of metal ions in the electroless metallizing solution is preferably selected from the group consisting of sources of copper ions, sources of nickel ions, sources of cobalt ions and mixtures thereof, more preferably sources of copper ions because of the high conductivity of copper deposits rendering copper or copper alloys particularly useful for the use in the electronic industry.

The electroless metallizing solution is typically an aqueous solution. The term "aqueous solution" means in this case that the prevailing liquid medium, which is the solvent in the solution, is water. Further liquids, that are miscible with water, as for example alcohols and other polar organic liquids, that are miscible with water, may be added. Preferably, the electroless metallizing solution comprises more than 90 wt.-% water based on all solvents present in the electroless metallizing solution, more preferably more than 99 wt.-% water, due to its ecologically benign character. The electroless metallizing solution may be prepared by dissolving all components in aqueous liquid medium, preferably in water.

If the metallizing solution is to deposit a copper or copper alloy on the surface obtained from step (c) of the substrate, the electroless metallizing solution comprises at least one source for copper ions. Such an electroless metallizing solution for the deposition of copper or copper alloys will hereinafter be referred to as "electroless copper plating bath". Sources of copper ions are typically water-soluble copper salts and copper complexes. Preferable sources of copper ions are selected from the group consisting of copper sulphate, copper chloride, copper nitrate, copper acetate and copper methane sulphonate.

An electroless copper plating bath comprises at least one source of copper ions (exemplarily selected from the group defined above), at least one reducing agent, at least one complexing agent, optionally one or more of enhancers, stabilising agents, accelerators (also referred to as exaltants in the art), surfactants (also referred to as wetting agents in the art), grain refining additives, acids, bases, buffers as pH adjustors. If a second source of reducible metal ions which is not a source of copper ions is present such as nickel or cobalt in the electroless copper plating bath, a copper alloy will be deposited.

Such components are widely known in the art and are disclosed exemplarily in the following documents which are incorporated by reference in their entirety: PCT/EP 2015/078679 (corresponding to European patent application no. 14198380.9; in particular page 4, line 9 to page 7, line 21 and page 10, line 3 to page 15, line 5) and WO 2014/154689 (in particular page 4, line 19 to page 12, line 34) disclose electroless copper plating baths and the components described above. Accelerators for electroless copper plating baths are taught in G. O. Mallory, J. B. Hajdu, Electroless Plating: Fundamentals And Applications, Reprint Edition, American Electroplaters and Surface Finishers Society, pp. 289-295. Further components are for example described in following documents, which are incorporated by reference in their entirety: U.S. Pat. No. 4,617,205 (particularly disclosure in column 6, line 17 to column 7, line 25), U.S. Pat. No. 7,220,296 (particularly column 4, line 63 to column 6, line 26, col. 4, lines 20 to 43 and 54 to 62), US 2008/0223253 (cf. particularly paragraphs 0033 and 0038).

The electroless copper plating bath is preferably held at a temperature in the range of 20 to 60° C., more preferably 30 to 55° C. and most preferably 33 to 40° C. during step (d).

In one embodiment of the present invention, the at least one source of metal ions comprised in the electroless metallizing solution is a source of nickel ions. Such an electroless metallizing solution for the deposition of nickel and nickel alloys will henceforth be called "electroless nickel plating bath". Suitable sources of nickel ions are water-soluble nickel salts and nickel complexes. Preferred sources of nickel ions are selected from the group consisting of nickel chloride, nickel acetate, nickel methanesulphonate, nickel carbonate and nickel sulphate.

An electroless nickel plating bath comprises the at least one source of nickel ions, at least one reducing agent, at least one complexing agent, and optionally one or more of the following components such as stabilising agents, plating rate modifiers, surfactants, accelerators, brighteners, grain refining additives.

Electroless nickel plating baths and the components mentioned above are known in the art. For example, PCT/EP 2015/078679 (page 4, line 9 to page 7, line 21 and page 15, line 6 to page 19, line 10) teaches electroless nickel plating baths and the components further comprising a plating rate modifier. WO 2013/113810 A2 (in particular page 3, line 14 to page 7, line 24) and EP 2 671 969 A1 (in particular paragraphs 9, 14 to 24, 32 to 46) which are incorporated by reference in their entirety also disclose electroless nickel plating baths and components used therein. If a second source of reducible metal ions, which is not a source of nickel ions, is present in the electroless nickel plating bath, a nickel alloy will be deposited. If a phosphorous-containing reducing agent such as a source of hypophosphite is used, phosphorous will be co-deposited with nickel forming a nickel phosphorus alloy. The same applies to boron based reducing agents forming nickel boron alloys in this case. If phosphorous containing reducing agents and boron based reducing agents are used, nickel boron phosphorous alloys are formed.

The electroless nickel plating bath is preferably held at a temperature in the range of 25 to 100° C., more preferably 35 to 95° C. and most preferably 70 to 90° C. during step (d).

In one embodiment of the present invention, the at least one source of metal ions comprised in the electroless metallizing solution is a source of cobalt ions. Such an electroless metallizing solution will henceforth be called "electroless cobalt plating bath".

The electroless cobalt plating bath comprises the at least one source of cobalt ions. Suitable sources of cobalt ions are water-soluble cobalt salts and water-soluble cobalt complexes. Preferably, the source of cobalt ions is selected from the group consisting of cobalt acetate, cobalt sulphate, cobalt chloride, cobalt bromide and cobalt ammonium sulphate.

The electroless cobalt plating bath further comprises at least one complexing agent, at least one reducing agent and optionally one or more of the following components such as stabilising agents, plating rate modifiers, pH buffers, wetting agents, surfactants, accelerators, brighteners, grain refining additives, oxygen scavengers etc. Such compounds are known in the art. Some suitable compounds and electroless cobalt plating baths are disclosed in US 2007/0167857 (in particular paragraph 20 to 23), US 2005/0161338 (in particular paragraph 46 to 55), WO 2013/135396 (in particular page 4, line 9 to page 8, line 20) and PCT/EP2015/078679 (in particular page 4, line 9 to page 7, line 21 and page 19, line 11 to page 23, line 3) which are incorporated by reference in their entirety. When using phosphorous containing reducing agents and/or boron based reducing agents, also secondary and ternary or higher alloys containing phosphorus and/or boron (like in the case of nickel) are obtained in the case of electroless cobalt plating baths. If a second source of reducible metal ions, which is not a source of cobalt ions, is present in the electroless cobalt plating bath, a cobalt alloy will be deposited. Preferable second sources of reducible metal ions are sources of molybdenum (including salts of molybdenum such as sodium molybdate) and sources of tungsten (including salts such as sodium tungstate).

The electroless cobalt plating bath is preferably held at a temperature in the range of 35 to 95° C., more preferably 50 to 90° C. and most preferably 70 to 85° C. during step (d).

The substrate is preferably treated with the electroless metallizing solution for 0.5 to 30 min, more preferably 1 to 25 min and most preferably 2 to 20 min during step (d). The treatment duration may also be outside said ranges in case a particularly thin or thick metal or metal alloy layer is desired. Suitable treatment durations can then be determined by routine experiments.

The substrate may be treated by any known means in the art with the electroless metallizing solution. Typically, the surface of the substrate is contacted with the electroless metallizing solution. The substrate may be entirely or partially immersed into the electroless metallizing solution; the electroless metallizing solution may also be sprayed or wiped thereon. By treating the surface of the substrate with the electroless metallizing solution, a deposit of a metal or metal alloy on the surface obtained from step (c) of said substrate will be formed.

Step (d.i): Heating

Optionally, the process according to the invention comprises a further step (d.i) heat-treating the substrate.

Such a heat-treatment of the substrate after electroless deposition of a metal or metal alloy in step (d) advantageously reduces the (internal) stress in the metal or metal alloy and removes moisture therefrom. Optional step (d.i) is included in the process according to the invention after step (d) and, preferably, before optional step (e) if the latter-named is also part of the process. Alternatively, optional step (d.i.) is included after optional step (e). Typical heat-treatments are carried out from 1 to 120 minutes, preferably from 5 to 90 minutes at a temperature ranging from 100 to 200° C., preferably 100 to 180° C.

Heat-treatments can be performed by any means known in the art. Typically, the substrate may be placed into an oven, may be subjected to infrared radiation and the like.

Step (e): Electrolytic Deposition

The process according to the invention optionally comprises after step (d) a further step (e)

(e) electrolytically depositing at least one metal or metal alloy onto the at least one surface obtained from step (d).

Optional step (e) is included in the process according to the invention after step (d). If the process according to the invention encompasses optional step (d.i), optional step (e) is included before or after optional step (d.i).

Electrolytic metallizing solutions (electrolytic plating baths) for various metals and metal alloys are known in the art. Exemplarily, a Watts nickel plating bath is typically used as a bright nickel bath, this comprising nickel sulphate, nickel chloride, boric acid, and also saccharine. An example of a composition used as a bright copper plating bath is one comprising copper sulphate, sulphuric acid, sodium chloride and organic sulphur compounds in which the sulphur is in a low oxidation state, for example organic sulphides or disulphides, as additives. Other electrolytic metallizing solutions have been disclosed for brass, bronze, tin, cobalt, chromium and many other metal and alloys. Such electrolytic metallizing solutions are referred to herein as "electrolytic metal or metal alloy plating baths". Preferably, the metal or metal alloy electrolytically deposited in step (e) is selected from the group consisting of copper, nickel, cobalt, chromium, tin, gold, silver, alloys and mixtures of the aforementioned.

It is particularly preferred in the process according to the invention, that the same metal or an alloy thereof is deposited in step (d) and in optional step (e). This circumvents the problem of interdiffusion of the metals or metal alloys deposited in step (d) and (e) into each other during use of products obtained from the process according to the invention.

More preferably, copper or a copper alloy is deposited in step (d) and in optional step (e). Even more preferably, pure copper is deposited in step (d) and step (e). Pure copper in the context of the present invention is to be understood as a copper deposit comprising 97 wt.-% of copper, preferably 98 wt.-% of copper, more preferably 99 wt.-% of copper. Such a high amount of copper in a formed deposit is particularly useful in the electronics industry where high amounts of copper are required because of the high conductivity of such deposits.

Preferably, in the case when a substrate with one or more recessed structure is selected which are to be filled with a metal or a metal alloy, preferably copper, more preferably pure copper, such as printed circuit boards, printed circuit foils, interposers, chip carriers, IC substrates, semiconductor wafers, circuit carriers and interconnect devices each comprising at least one recessed structure with trenches, blind micro vias (BMV), through hole vias (THV), through glass vias (TGV), through silicon vias (TSV), buried vias (or those vias which are to become such buried vias during later stages of the manufacturing process) and mixtures of the any of the aforementioned an electrolytic copper plating bath is used in optional step (e).

For this purpose, an electrolytic copper plating bath comprising at least one source of copper ions, at least one acid, and optionally one or more of the following components including accelerator-brightener additives, carrier-suppressor additives, leveller additives, sources of halide ions, wetting agents, further sources of reducible metal ions such as sources of gold ions, sources of tin ions, sources of silver ions, and sources of palladium ions, more preferably selected from sources of gold ions and sources of silver ions are employed to deposit copper (or a copper alloy) into the recessed structures.

Said components are known and can be found in various teachings in the art. Exemplarily, said components are disclosed in WO 2014/079737 A2 (in particular page 3, line 16 (particularly, starting in section "detailed description of the invention") to page 13, line 3), PCT/EP2016/058704 (in particular page 4, line 5 to page 19, line 24) and US 2014/0209476 A1 (in particular paragraphs 8 to 11, 23 to 34, 52 to 53) which are incorporated herein by reference in their entirety.

In a preferred embodiment of the present invention, the electrolytic copper plating bath contains only copper ions as reducible metal ions (disregarding traces of impurities commonly present in technical raw materials and redox couples such as Fe(II)/Fe(III)). It is known in the art that the deposition from any electrolytic copper plating bath may be hampered by the presence of other reducible metal ions besides copper. An electrolytic copper plating bath containing also arsenic and/or antimony is exemplarily known to produce brittle and rough copper deposits and thus it is preferred that electrolytic copper plating bath is free from intentionally added arsenic and/or antimony ions. Nickel as further metal ion source is known not to be co-deposited along with copper from an acidic plating bath in an electrolytic process, but reduces the conductivity of such a bath and thus makes the electrolytic deposition less efficient (cf. page 75 of "Modern Electroplating", $4^{th}$ Edition, 2000, edited by M. Schlesinger, M. Paunovi, John Wiley & Sons, Inc., New York). Therefore, it is preferred that the electrolytic copper plating bath is free of (intentionally added) further reducible metal ions including ions of nickel, cobalt, zinc, arsenic, antimony, bismuth, lead, tungsten, molybdenum, rhenium, ruthenium, rhodium, osmium, iridium, platinum, mercury. Non-reducible metal ions include inter alia alkaline and earth alkaline metal ions which cannot be reduced under the conditions typically applied.

It is particularly preferred that the electrolytic copper plating bath is capable to form pure copper deposits and thus is free of (intentionally added) sources of ions of nickel, cobalt, zinc, silver, gold, arsenic, antimony, bismuth, tin, lead, tungsten, molybdenum, rhenium, ruthenium, rhodium, palladium, osmium, iridium, platinum, and mercury. More preferably, the electrolytic copper plating bath contains less than 1 g/L of the above named reducible metal ions, even more preferably less than 0.1 g/L of the above named reducible metal ions, yet even more preferably less than 0.01 g/L of the above named reducible metal ions, most preferably it is substantially free of such reducible metal ions listed above.

The electrolytic deposition of a metal or metal alloy, preferably copper, often includes the steps (e.i) contacting (at least one portion of) the surface of the substrate with the electrolytic metal or metal alloy plating bath, and (e.ii) applying an electrical current between the substrate and at least one anode, and thereby depositing a metal or metal alloy, preferably copper or a copper alloy, on (at least one portion of) the surface of the substrate. The electrolytic metal or metal alloy plating bath is preferably operated in the process according to the present invention in a temperature range of 15° C. to 50° C., more preferably in a temperature range of 25° C. to 40° C. by applying an electrical current to the surface of the substrate and at least one anode. Preferably, a cathodic current density range of 0.05 A/dm$^2$ to 50 A/dm$^2$, more preferably 0.1 A/dm$^2$ to 30 A/dm$^2$ is applied. The substrate is contacted with the electrolytic metal or metal alloy plating bath for any duration necessary to deposit the desired amount of metal or metal alloy. This duration preferably ranges from 1 second to 6 hours, more preferably for 5 seconds to 120 minutes, even more preferably for 30 seconds to 75 minutes. The substrate and the electrolytic metal or metal alloy plating bath can be contacted by any means known in the art. This includes inter alia immersion of the substrate into the bath or the use of other plating equipment. The electrolytic deposition is either performed by DC plating (direct current plating), by alternating current plating and/or by reverse pulse plating. Both inert and soluble anodes can be utilised when depositing metal or metal alloy from the electrolytic metal or metal alloy plating bath. The substrate or at least one portion of its surface are contacted with the electrolytic metal or metal alloy plating bath by means of spraying, wiping, dipping, immersing or by other suitable means. Thereby, a metal or metal alloy layer is obtained on at least one portion of the surface of the substrate.

The solutions, i.e. the activation solution, the treatment solution and the metallizing solution(s) can be prepared by dissolving all components in aqueous medium, preferably in water. In order to guarantee the complete solubilisation of components in the respective solutions, the pH may be adjusted using acids and/or bases or co-solvents may be employed.

The process according to the invention optionally comprises further steps such as rinsing steps which may be included in the process according to the invention before, between or after any of the described steps. Rinsing can be accomplished by treatment of the substrate with solvents, preferably water, more preferably deionised water. The process according to the invention optionally further comprises drying steps. Drying can be done by any means known in the art such as elevated temperature or air drying.

Preferably, the solutions in the process according to the invention are subject to (internal) movement. Such movement can be accomplished through stirring, pumping of the solution, air feeding into the solution, spray applications and the like. This guarantees homogeneous solutions which then allow for homogeneous treatments of the at least one surface of the substrate.

In the process according to the invention, the substrate is treated the respective solutions (such as the solutions used for pre-treatment in step (a.i), the activation solution in step (b), the treatment solution in step (c) and the metallizing solution in step (d) and the optional electrolytic metallizing solution in optional step (e)) by conventional means known in the art. It is possible and preferred for the ease of process handling, that the treatment of the substrate in all steps of the process according to invention is the same.

Preferably, the substrate is entirely or partially immersed into the respective solutions or the solutions are preferably sprayed or wiped thereon.

The treatment of (at least one portion of the) at least one surface of the substrate with the solutions of the process according to the invention is preferably performed in horizontal, reel-to-reel, vertical and vertically conveyorized plating equipment. A particularly suitable plating tool which can be used to carry out the process according to the present invention is disclosed in US 2012/0213914 A1. The person skilled in the art is aware of the fact that treatment durations may vary depending on the plating equipment used. Vertical processes usually require prolonged durations compared to horizontal plating equipment. The adjustment of useful treatment times can be achieved with routine experiments. The process according to the invention preferably does not comprise any lamination of the substrate obtained in any of the described steps to copper foils.

The present invention is also directed at the substrates treated with the process according to the invention.

The present invention also relates to a use of the additives selected from the group consisting of thiols, thioethers, disulphides and sulphur containing heterocycles in decrease of the decomposition rate of reducing agents in a solution, preferably in aqueous solutions.

The at least one additive selected from the group consisting of thiols, thioethers, disulphides and sulphur containing heterocycles is preferably used to decelerate the metal-promoted decomposition of one or more reducing agent selected from the group consisting of boron based reducing agents, sources of hypophosphite ions, hydrazine and hydrazine derivatives, ascorbic acid, iso-ascorbic acid, sources of formaldehyde (including formaldehyde itself), sources of glyoxylic acid (including glyoxylic acid itself), glycolic acid, formic acid, sugars (including polysaccharides), and salts of aforementioned acids in a (aqueous) solution.

The at least one additive selected from the group consisting of thiols, thioethers, disulphides and sulphur containing heterocycles is preferably used to decelerate the metal-promoted decomposition of one or more reducing agent selected from the group consisting of amino boranes, ammonia borane, borohydrides (including alkaline borohydrides, cyanoborohydrides and alkylborohydrides), borane and homologues thereof (such as diborane including alkylboranes) in a (aqueous) solution.

The at least one additive selected from the group consisting of thiols, thioethers, disulphides and sulphur containing heterocycles is more preferably used to decelerate the metal-promoted decomposition of one or more reducing agent selected from the group consisting of amino boranes, ammonia borane, borohydrides (including alkaline borohydrides, cyanoborohydrides and alkylborohydrides), borane and homologues thereof (such as diborane and alkylboranes) in a (aqueous) solution.

The at least one additive selected from the group consisting of thiols, thioethers, disulphides and sulphur containing heterocycles is even more preferably used to decelerate the palladium-promoted decomposition of one or more reducing agent selected from any of the above-defined groups; yet even more preferably, to decelerate the palladium-promoted decomposition of said one or more reducing agents while palladium or ions thereof are adsorbed on a surface of a substrate, preferably at least one surface of a substrate selected from the group consisting of printed circuit boards, printed circuit foils, interposers, chip carriers, IC substrates, semiconductor wafers (semiconductor substrates), circuit carriers, interconnect devices and precursors for any of the aforementioned in a (aqueous) solution.

The use of the at least one additive results advantageously in reduced decomposition rates of the one or more reducing agents in a (aqueous) solution compared to a (aqueous) solution which does not contain any additive selected from above-defined group but with otherwise identical settings and parameters.

Without being bound by theory and without limiting the scope of the present invention, it is believed by the inventors that residues of the activation solution which are being carried over into subsequent solutions such as those treatment solutions containing reducing agent suitable to reduce the metal ions adsorbed on surfaces of the substrate are one of the reasons for the decomposition of the reducing agents present in such solutions.

A treatment solution containing at least one reducing agent suitable to reduce metal ions adsorbed on the surface of the substrate which is being polluted by drag-in of activation solutions are herein referred to as "used reducing solutions". In one case, the at least the one additive selected from the group consisting of thiols, thioethers, disulphides and sulphur containing heterocycles is used to decelerate the decomposition rate of the one or more reducing agents in a used reducing solutions (see Example 5). Due to said drag-in, it is sometimes required to increase the concentrations of the at least the one additive selected from the group consisting of thiols, thioethers, disulphides and sulphur containing heterocycles (and/or sometimes of the at least one reducing agent) in order to maintain an efficient process. The preferred embodiments described in this specification (particularly those for step (b) and step (c) of the process according to the invention) apply for the use of the additive mutatis mutandis.

It is one advantage of the present invention, that the decrease of the decomposition rate of the reducing agent in the treatment solution in step (c) reduces costs and the amount of used chemicals. This decrease of the decomposition rate of the at least one reducing agent is particularly effective when using thiols, thioethers, disulphides and sulphur containing heterocycles. This is particularly important when boron based reducing agents, preferably aminoboranes such as amino boranes, ammonia borane, borohydrides (including alkaline borohydrides, cyanoborohydrides and alkylborohydrides), borane and higher homologues thereof (such as diborane and alkylboranes), are used which are widely employed due to their effectiveness and stability in alkaline media since they form borates. Such borates are considered to be harmful and are listed as substance of very high concern by the ECHA because of their possible toxicity for reproduction and teratogenic potential.

It is further advantage that the use of the additive in the process according to the invention does not impair other parameters and results obtained therefrom. The process is neither lengthened nor does it lead to worse metal or metal alloy depositions.

Also, the results of the process according to the invention such as coverage of the treated surface of the substrate with a metal or metal alloy are at least as good as in the case when no additive is employed in the treatment solution (see examples 1 to 3 and 6). Further results which are at least as good (see example 6) are:

Substrate coverage with metal or metal alloy within through-holes (measurable by the backlight test)

Effectiveness of deposition of metal or metal alloy in blind microvias (measurable by the daisy chain test)

adhesion of the deposited metal or metal alloy to the surface of the substrate adhesion of the deposited metal or metal alloy to a surface bound metal or metal alloy from preceding or following process steps (measurable by the so-called solder shock test, thermal cycling test (TCT) and interconnect stress test (IST)

In a particularly preferred embodiment of the present invention, the process for depositing a metal or metal alloy on (at least one portion of) at least one surface of a substrate comprising at least one recessed structure comprises the steps in the given order (a) providing said substrate comprising at least one recessed structure (a.i.) Optionally, pretreating (at least the portion of) the surface of the substrate;

(a.ii) preferably, treating (at least the portion of) the surface of the substrate with a pre-dip;

(b) treating (at least the portion of) the surface of said substrate with an activation solution comprising at least one source of metal ions selected from the group consisting of ruthenium, rhodium, palladium, osmium, iridium, platinum, copper, silver, nickel, cobalt and gold, preferably palladium, such that at least one portion of said metal ions is being adsorbed on (at least the portion of) the at least one surface of said substrate;

(c) treating (at least the portion of) the surface of said substrate obtained from step (b) with a treatment solution comprising i) at least one additive selected from the group consisting of thiols, thioethers, disulphides and sulphur containing heterocycles, and ii) at least one reducing agent suitable to reduce the metal ions is being adsorbed on (at least the portion of) the at least one surface of said substrate; and (d) treating (at least the portion of) the surface of said substrate obtained from step (c) of said substrate with a metallizing solution to deposit a metal or metal alloy thereon;

(e) and optionally, electrolytically depositing at least one metal or metal alloy onto the (at least the portion of) the surface obtained from step (d) such that a metal or metal alloy is deposited thereon.

Preferably, the recessed structures are at least partially, more preferably completely, filled with the metal or metal alloy used in step (d) and optionally in step (e).

In this embodiment, the substrate is preferably selected from the group consisting of printed circuit boards, printed circuit foils, interposers, chip carriers, IC substrates, semiconductor wafers (semiconductor substrates), circuit carriers and interconnect devices comprising at least one recessed structure. Such recessed structures are preferably selected from the group consisting of trenches, blind micro vias (BMV), through hole vias (THV), through glass vias (TGV), through silicon vias (TSV), buried vias and mixtures of the any of the aforementioned.

Mostly, such substrates comprise a plurality of said recessed structures.

Preferably, the metal used in step (d) and optional step (e) is copper due to its high conductivity. More preferably, the electrolytic metallizing solution in step (e) employs an electrolytic copper plating bath. Further, preferred embodiments described in this specification apply for this embodiment mutatis mutandis.

EXAMPLES

The invention will now be illustrated by reference to the following non-limiting examples. Securiganth™ 902 Cleaner, Securiganth™ Etch Cleaner SPS, Neoganth™ B PreDip, Neoganth™ Activator 834, Neoganth™ U Activator, Neoganth™ Reducer P-WA and Printoganth™ PV, Printoganth™ P plus are products produced and distributed by Atotech Deutschland GmbH. These products were used according to the specification in the technical datasheets unless stated otherwise herein. In the case of examples 1 to 5, the product versions for vertical production (V) were used whenever existing. For production examples 6 to 8 in a horizontal LB-Line (Uniplate™ LB) the versions for horizontal treatment (H) were used. Securiganth™ 902 Cleaner is an alkaline solution comprising a surfactant. Securiganth™ Etch Cleaner SPS is acidic solution comprising sodium persulfate (SPS) as an oxidising agent, Neoganth™ B PreDip is an aqueous solution comprising an amine containing compound, Neoganth™ Activator 834 is an aqueous solution comprising 200 mg/L palladium ions, Activator Neoganth™ U is an aqueous solution comprising 225 mg/L palladium ions. Neoganth™ Reducer P-WA is an aqueous solution comprising dimethylamine borane as reducing agent. Printoganth™ PV and Printoganth™ P plus are electroless metallizing solutions for the deposition of copper:

Printoganth™ PV was prepared by dissolving 85 mL/L Printoganth™ V Basic (an aqueous solution containing complexing agents), 2 g/L sodium hydroxide, 45 ml/L Printoganth™ V Copper (a solution comprising a copper salt), 8 mL/L Printoganth™ PV Starter (a solution of organic additives), 1.2 mL/L Printoganth™ PV Stabilizer (another solution of organic additives) and 16 mL/L Cu-reduction solution (an aqueous formaldehyde solution) in water (840 mL/L bath). SPS is an abbreviation for sodium persulphate.

Substrates:

For deposition tests, bare-laminate FR-4 substrates (MC10EX from Panasonic) were used. For evaluation of the through-hole coverage, coupons based on the materials IS410 (from Isola), 158TC (from ITEQ), R-1755C (from Matsushita/Panasonic) NP140 (from Nan Ya), S1141 (from Shengy) were utilized. The hole diameter in the coupons was 1 mm. Solder shock test coupons IS410 form Isola, HR7 design with 1mm hole diameter were used. If necessary, the substrates were subjected to a desmear treatment which is known in the art.

Determination of the Dimethylaminoborane (DMAB) Concentration by Titration in Aqueous Solutions:

An aliquot of 25 mL of a bath to be analysed was transferred into an Erlenmeyer flask. Acetate buffer (10 mL, pH=4.7, 1 mol/L acetic acid +1 mol/L sodium acetate) and water (deionised, 40 mL) were added. The solution was titrated using an aqueous $I_2$ (0.05 mol/L) solution. A few drops of starch solution were added to visualize the equivalence point. Titrations were carried out using a Metrohm 665 dosimat or Metrohm 766 dosimat system (Deutsche Metrohm GmbH, Germany).

Evaluation of the Coverage of the at Least One Surface of a Substrate After Step (d)

The quality of the process can roughly be determined by optical inspection of the metal or metal alloy deposited in step (d), e.g. by an electroless copper plating bath, on a FR-4 substrate. Herein, three different cases were distinguished: a) Full coverage of the substrate with a metal layer; b) partial coverage of the substrate with a metal layer and/or differences in the colour of the deposits; c) no metal deposition at all. It is desired that the surface of the substrate is fully covered with the metal or metal alloy deposited in step (d). If is only partially covered or not covered at all, then the results are not satisfactory.

Backlight Method: Investigation of Metal or Metal Alloy Coverages of Surfaces in Recessed Structures The coverage of the surfaces of recessed structures with metal or metal alloy in the process can be assessed using an industry standard Backlight Test, in which a plated coupon is sectioned, so as to allow areas of incomplete coverage to be detected as bright spots when viewed over a strong light source [confer US 2008/0038450 A1, incorporated herein by reference in its entirety]. The quality of the metal or metal alloy deposit is determined by the amount of light that is observed under a conventional optical microscope.

The results of the backlight measurement are given on a scale from D1 to D10, wherein D1 means the worst result and D10 the best result. Reference samples showing results from D1 to D10 are shown in FIG. 3 of WO 2013/050332 (incorporated herein by reference).

Example 1

A Thioether as Additive

FR-4 substrates (MC 10EX from Panasonic) and desmeared backlight coupons (Matsushita R-1755C) were used in the process described in the following table. The substrates were immersed in the given order for the time and temperature as given in Table I into the solutions.

TABLE I

Process for depositing copper on substrates.

| # | Product | Makeup | corresponds to | t [min] | T [° C.] |
|---|---|---|---|---|---|
| 1 | Securiganth ™ 902 Cleaner | 40 mL/L | step a.i. | 4 | 60 |
| 2 | Securiganth ™ Etch Cleaner SPS | 150 g/L SPS 35 mL/L $H_2SO_4$ (50 wt.-%) | step a.i. | 1 | 30 |
| 3 | Neoganth ™ B PreDip | 10 mL/L | step a.ii. | 1 | 20 |
| 4 | Neoganth ™ Activator 834[1] | 40 mL/L | Step b. | 4 | 40 |
| 5 | Solution described below | | Step c. | 0.75 | 35 |
| 6 | Printoganth ™ PV[2] | | Step d. | | 34 |

[1]Neoganth Activator 834 bath was prepared by adding 40 mL/L of the concentrate to a solution of 2.5 g/L sodium hydroxide in water, leading to a solution with 200 mg/L Pd. The pH was adjusted to 11.3 and the solution heated for 2 hours at 50° C. before it was used as described.
[2]See description above.

The duration of step #6 (corresponding to step d. of the process according to the invention) was 5 min in case of the FR-4 substrates and 10 min in case of the backlight coupons.

In #5 of Table I, solutions of Neoganth™ Reducer P-WA (3 mL/L) were applied which additionally contained 2,2'-thiobis(ethan-1-ol) in concentrations as given in the following table. The results of the coverage of FR-4 substrates and the backlight values are summarised in Table II. The copper coverage was evaluated on the basis of the treated FR-4 substrates. The backlight values were obtained from the backlight coupons.

TABLE II

Results of copper deposition on substrates.

| Example | Concentration of 2,2'-thiobis(ethan-1-ol) | Coverage | Backlight (D value) |
|---|---|---|---|
| 1a | 0 mg/L | Full | 5.5 |
| 1b | 0.1 mg/L | Full | 5.5 |
| 1c | 1 mg/L | Full | 5.5 |
| 1d | 5 mg/L | Full | 5.5 |
| 1e | 10 mg/L | Full | 5.5 |
| 1f | 20 mg/L | Full | 5.5 |
| 1g | 50 mg/L | Partial | 5.5 |

No significant influence on the copper deposition in step (d) of the process according to the invention on FR-4 substrates was observed up to concentrations of 20 mg/L. At a concentration of 50 mg/L, the copper deposition yielded only a partially covered substrate. The backlight tests showed similar results and no worsening could be observed until said concentrations. In the case of employing concentrations above said threshold such as 100 mg/L, the backlight test results deteriorated.

Example 2

A Thiol as Additive

The process outlined in Example 1 was repeated with another additive used in the treatment solution in lieu of 2,2'-thiobis-(ethan-1-ol) (#5 of Table I). Individual treatment solutions containing the thiol dithiothreitol in concentrations as given in the following table were used. The results are summarized in Table III.

TABLE III

Results of copper deposition on substrates.

| Example | Concentration of dithiothreitol | Coverage | Backlight (D value) |
|---|---|---|---|
| 2a | 0 mg/L | Full | 6.5 |
| 2b | 0.02 mg/L | Full | 6.5 |
| 2c | 0.05 mg/L | Full | 6.5 |
| 2d | 0.1 mg/L | Full | 7 |
| 2e | 0.5 mg/L | No | 4.5 |
| 2f | 1 mg/L | No | 2 |

No significant influence on the copper deposition on FR-4 substrates was observed up to concentrations of 0.1mg/L. Higher concentrations of the additive yielded impaired copper depositions in step (d) of the process according to the invention. The backlight tests showed similar results and no worsening could be observed until said concentration. Only, when employing concentrations above said threshold such as 0.5 or even more so at 1 mg/L, the backlight test results deteriorated.

Example 3

A Sulphur Containing Heterocycle as Additive

The process outlined in Example 1 was repeated with another additive used in the treatment solution (#5 of Table I). Individual treatment solutions containing the sulphur containing heterocycle mercaptobenzothiazole in concentrations as given in the following table were used. The results are summarized in Table IV.

TABLE IV

Results of copper deposition on substrates.

| Example | Concentration of mercaptobenzothiazole | Coverage | Backlight (D value) |
|---|---|---|---|
| 1 | 0 mg/L | Full | 6.5 |
| 2 | 0.02 mg/L | Full | 6.5 |
| 3 | 0.05 mg/L | Full | 6.5 |
| 4 | 0.1 mg/L | Full | 7 |
| 5 | 0.5 mg/L | No | 4.5 |
| 6 | 1 mg/L | No | 2 |
| 7 | 5 mg/L | No | 1 |
| 8 | 10 mg/L | No | 1 |

No significant influence on the deposition of copper on FR-4 material was observed up to concentrations of 0.1 mg/L. Above said value, the deposition of copper became less good. Also, the backlight tests showed similar results until said concentration and no worsening could be observed. Only, when employing concentrations above said threshold such as 0.5 mg/L or even more so at 1 mg/L, the backlight test results deteriorated.

Examples 1 to 3 showed that the use of the additives did not result in impaired copper deposition in step (d) over wide concentration ranges of the process according to the invention.

Example 4

Simulation of Drag-in of Activation Solutions into Treatment Solutions

To simulate polluted treatment solutions in a running process line, freshly made-up aqueous solutions containing a reducing agent were charged with Neoganth™ Activator 834 bath so that the first-mentioned solutions contained 200 µg/L to 400 µg/L palladium (200 µg/L for experiments 2-6 in Table V, 400 µg/L for experiments 7-12 in Table V).

The freshly made-up solution comprised:
dimethylaminoborane (500 mg/L)
pH value ranged between 9 and 10
the balance being water Then, the decomposition of dimethylaminoborane was measured over time at 35° C. After 2 hours, the additives as given in Table V were added to individual solutions and the decomposition of the reducing agent was further monitored over time.

The decrease of the decomposition rate was obtained by measuring the kinetics of the decomposition rate of the reducing agent before and after the addition of the additive. Since both reactions follow a zeroth order behaviour, the following equation applies:

$$k = v = \frac{d(c(\text{reducing agent}))}{dt}$$

with k being the reaction constant and v the reaction velocity, c(reducing agent) being the concentration of the reducing agent By dividing the reaction constant of the decomposition reaction before and after the addition of the additive (and forming the percentage), the effect of the additive on the decomposition of the reducing agent can be obtained. This value is given (as percentage) in Table V and referred to herein as "Reduction of decomposition rate".

TABLE V

Influence of additives in the treatment solutions on the decomposition of reducing agents.

| # | Additive | Concentration | decrease of decomposition rate |
|---|---|---|---|
| 1 | — | — | 0% |
| 2 | 2-(Hydroxymethyl)benzothiazole | 100 µg/L | 49% |
| 3 | 4-Mercaptophenole | 20 µg/L | 26% |
| 4 | Dithiothreitol | 50 µg/L | 35% |
| 5 | Mercaptobenzothiazole | 50 µg/L | 92% |
| 6 | Thiabendazole | 500 µg/L | 21% |
| 7 | 2,2'-thiobis(ethan-1-ol) | 5 mg/L | 54% |
| 8 | 2-Mercaptoethan-1-ol | 20 µg/L | 87% |
| 9 | Cystamine dihydrochloride | 50 µg/L | 97% |
| 10 | 2-Methylthio-benzimidazole | 1 mg/L | 97% |
| 11 | 2-Methylthio-ethylamine | 1 mg/L | 74% |

All additives showed a significant lower decomposition rate of the reducing agent to be used in step (c). Among others, the lifetime of such a treatment solution used in step (c) may be greatly prolonged. This in turn allows for a great saving of chemicals and for an ecologically more benign process to be run.

Moreover, from the data in Table V can be concluded that thiols, such as #3, #4, #5, #8 and disulphides, such as #9 were most effective, as they allowed for a significant saving—even when employed in such low concentration of 20 to 50 µg/L. Sulphur containing heterocycles and thioethers that did not contain any thiol groups or disulphane groups and that further comprise one or more nitrogen atoms required generally higher concentrations (see #2, #6, #10, #11 of Table V). The highest concentration was needed to obtain an effective saving in the case of a nitrogen-free thioether, i.e. 2,2'-thiobis-(ethan-1-ol) (#7 in Table V).

The effect of an additional sulphur containing functional group such as a thiol group can be seen from entries #2 and #5 in Table V. Additives otherwise identical with the same sulphur containing heterocycle showed significant differences. Mercaptobenzothiazole being employed in only half the concentration slowed down the decomposition of the reducing agent by 92% while the hydroxymethyl derivative reached 49%.

Example 5

Simulation of a Used Treatment Solution

In four beakers, aqueous solutions (2 L) of Neoganth™ Reducer P-WA containing dimethylamine borane as reducing agent (5 mL/L) were provided. FR-4 substrates (10×10 cm$^2$) were treated according to the process described in entries 1 to 4 of Table I. In the four solutions 12.5, 25, 50 and 100, respectively, FR-4 substrates were immersed for 45 seconds each at 35° C.

The decomposition rate of the reducing agent was measured over time for 60 min before the substrates were immersed into the solution and at least for further 60 min after the immersion of the substrates. Then, 2,2'-thiobis (ethan-1-ol) in a concentration of 10 mg/L was added to the solution into which 25 FR-4 substrates were immersed and the decrease of the decomposition rate was thus monitored for further 60 min.

No decomposition of the reducing agent before the immersion of the FR-4 substrates was found. After immersion of the FR-4 samples for 45 seconds, a continuous decrease of the reducing agent in solution was observed. The change of the reducing agent concentration over time is shown in table VI.

TABLE VI

Decomposition rate of reducing agent in used treatment solutions.

| # | No. Substrates | Decomposed reducing agent after 60 min |
|---|---|---|
| 1 | 12.5 | −0.17 mL/L per hour |
| 2 | 25 | −0.38 mL/L per hour |
| 3 | 50 | −0.64 mL/L per hour |
| 4 | 100 | −1.13 mL/L per hour |

The data in Table VI showed that i) the throughput of FR-4 samples treated according to entries 1 to 4 in Table I initiated a continuous decomposition of reducing agent and that ii) a higher substrate throughput lead to higher decomposition values.

In a second part of the experiment, 2,2'-thiobis(ethan-1-ol) was added in a concentration of 10 mg/L to the solution that was used for treatment of 25 FR-4 samples. The decomposition rate of the reducing agent was monitored for further 60 min. It was found that the addition of the thioether led to a decrease of the decomposition rate to a value of −0.054 mL/L per hour, which equals a saving of 86%. The additive clearly decreased the decomposition rate of the reducing agent. The additive can thus be used to decrease the decomposition rate of the reducing agent in a freshly made treatment solution or in a used treatment solution.

Example 6

Production Trial

In a freshly cleaned horizontal plating line (Uniplate™ LB, horizontal plating equipment manufactured and distributed by Atotech Deutschland GmbH, 1 m/min line speed) FR-4 substrates were treated by the process described in Table VII. Production was carried out for 2 days with an average throughput of 60 m$^2$ FR-4 substrates per day (5 mL/L Neoganth™ Reducer P-WA). In the next week, when the drag-in of the activation solution into the solution containing the reducing agent had been precipitated, partially accumulated in the filters of the modules filtration system and adsorbed on the surfaces of the module, a set of tests was carried out.

TABLE VII

Process sequence for depositing metal on FR-4 substrates.

| # | Product[1] | Make-up | Treatment duration [s] | Temperature [° C.] | Corresponds to step |
|---|---|---|---|---|---|
| 1 | Securiganth ™ Cleaner 902 ULS | 40 mL/L | 60 | 45 | a.i |
| 2 | Securiganth ™ Etch Cleaner SPS | 150 g/L SPS 35 mL/L H$_2$SO$_4$ (50 wt.-%) | 60 | 30 | a.i |
| 3 | Neoganth ™ B PreDip | 10 mL/L | 20 | 30 | a.ii |
| 4 | Activator Neoganth ™ U[2] | 225 mL/L | 45 | 30 | b |
| 5 | Treatment solution | See below | 45 | 35 | c |
| 6 | Printoganth ™ P-Plus[3] | | 360 | 32 | d |

[1]Product versions for horizontal treatment used;
[2]Activator Neoganth ™ U bath was prepared by adding 225 mL/L of the concentrate to a solution of 0.56 g/L sodium hydroxide in water (775 mL), leading to a solution with 225 mg/L Pd. The pH was adjusted to 10.0;
[3]See description above.

At first, the decomposition of the reducing agent in the reduction bath (#5 in Table VII) was determined under standard conditions (35° C., no additive) by several titrations as outlined above. Said solution was an aqueous solution comprising about 0.35-0.8 g/L dimethylamine borane as reducing agent in water (pH=10–10.5), depending on the extent of the decomposition of the reducing agent. During the measurement of the decomposition rate, no reducing agent was added.

Then, 2,2'-thiobis(ethan-1-ol) was added and the concentration of the compound stepwise increased to 1, 2.5, 5 and 10 mg/L. For all mentioned concentrations, decomposition rates of the reducing agent were determined. In between the different experiments, additional dimethylamine borane was added because of high decomposition in the module. As discussed in example 4, the decomposition rates with additive were brought in relation to the rate obtained without additive and the percental reduction of the decomposition rate was calculated. The results are summarized in Table VIII.

TABLE VIII

Influence of the concentration of the additive on the decomposition rate of the reducing agent DMAB in the production trial.

| # | Additive | concentration [mg/L] | Decrease of the decomposition rate |
|---|---|---|---|
| 1 | None | — | 0% |
| 2 | HO~~S~~OH | 1 | 8% |
| 3 | HO~~S~~OH | 2.5 | 10% |
| 4 | HO~~S~~OH | 5 | 17% |
| 5 | HO~~S~~OH | 10 | 17% |

The results listed in Table VIII show that the additive, 2,2'-thiobis(ethan-1-ol) which is a thioether, decreased the decomposition rate of the reducing agent. Compared to a treatment solution not containing any additives selected from the group consisting of thiols, thioethers, disulphides and sulphur containing heterocycles (entry #1), all the treatment solutions comprising such an additive showed a significant decrease of the decomposition rate of the reducing agent. In this experiment, a saving of 17% was obtained by using 5-10 mg/L 2,2'-thiobis(ethan-1-ol).

In between the determination of decomposition rates, backlight coupons of different materials (ITEQ 158TC, NanYa NP140, Matsushita R-1755C) were processed ( Table IX, 60 mbar floodbar pressure) with concentrations of 0 mg/L, 1 mg/L, 5 mg/L and 10 mg/L of 2,2'-thiobis (ethan-1-ol). The obtained coupons were evaluated concerning through-hole coverage in the backlight test (i.e. deposition of copper). The results are summarized in Table IX. The data showed that within the chosen concentration range of the thioether no worsening of the backlight results was obtained in comparison to the process without any additive.

Along with the backlight coupons, thermal cycling test (TCT) coupons (S1000 from Shengy) were used employing 2,2'-thiobis(ethan-1-ol) in concentrations of 0 mg/L and 10 mg/L. The dimethylamine borane concentration in the solution of entry #5 of Table VII was approximately 0.5 g/L. After deposition of copper as described in Table VII, a further copper layer was electrolytically deposited (corresponds to optional step (e) of the process according to the invention, 40 μm copper). The substrates were submitted to structuring and then investigated concerning reliability by thermal cycling test according to IPC 2.6.26 and IEC-60068-2-4, which is known in the art. Cycling was done 1000 times (−40° C./125° C., 15 min/15 min) with 6 coupons of the process using no additive and with 6 coupons that were processed with a treatment solution containing 10 mg/L of the thioether. The test evaluated the adhesion of the different copper deposits in a printed circuit board towards each other under thermal stress conditions. The formation of defects was detected by an increase of the electrical resistivity. All test coupons showed an electrical resistance increase of less than 3% in the power circuit and therefore passed the test. This demonstrates that the presence of the thioether in the treatment solution of the PTH process (i.e. a process directed at depositing a metal or metal alloy into recessed structures, in particular for the deposition metal or metal alloy on surfaces of plating through-hole) does not negatively affect the reliability of printed circuit boards.

TABLE IX

Results obtained from a production trial.

| # | Substrate | Additive | c [mg/L] | Floodbar pressure [mbar] | Backlight test [D value] |
|---|---|---|---|---|---|
| 1 | ITEQ 158 TC | None | 0 | 60 | 7.9 |
| 2 | ITEQ 158 TC | HO~~S~~OH | 1 | 60 | 7.5 |
| 3 | ITEQ 158 TC | HO~~S~~OH | 5 | 60 | 8.0 |
| 4 | ITEQ 158 TC | HO~~S~~OH | 10 | 60 | 7.8 |
| 5 | Matshushita 1755 C | None | 0 | 60 | 7.6 |

TABLE IX-continued

Results obtained from a production trial.

| # | Substrate | Additive | c [mg/L] | Floodbar pressure [mbar] | Backlight test [D value] |
|---|---|---|---|---|---|
| 6 | Matshushita 1755 C | HO-CH₂CH₂-S-CH₂CH₂-OH | 1 | 60 | 7.7 |
| 7 | Matshushita 1755 C | HO-CH₂CH₂-S-CH₂CH₂-OH | 5 | 60 | 8.2 |
| 8 | Matshushita 1755 C | HO-CH₂CH₂-S-CH₂CH₂-OH | 10 | 60 | 7.9 |
| 9 | Nanya NP 140 | None | 0 | 60 | 7.5 |
| 10 | Nanya NP 140 | HO-CH₂CH₂-S-CH₂CH₂-OH | 1 | 60 | 7.9 |
| 11 | Nanya NP 140 | HO-CH₂CH₂-S-CH₂CH₂-OH | 5 | 60 | 7.5 |
| 12 | Nanya NP 140 | HO-CH₂CH₂-S-CH₂CH₂-OH | 10 | 60 | 7.5 |

(Additive structure: HO−CH$_2$−CH$_2$−S−CH$_2$−CH$_2$−OH, i.e. 2,2'-thiobis(ethan-1-ol))

Example 7

Used Plating Line

Above-described procedure in Example 6 was repeated in a horizontal plating line of the same type but which contained an artificially polluted reducer module. The reducer module was used for the treatment of the substrate with the treatment solution. The polluted module was prepared from a clean module by insertion of 14 filters from the activator module (5 μm×Norminal×250 mm from TCK Micro Filter Co. Ltd., polypropylene, double open gasket) that have previously been used for filtration of Activator Neoganth™ U bath for a period of about 25 hours. The module was filled with water and the filtration system switched on to distribute the treatment solution in the whole module. Dimethylamine borane (0.5 g/L) was added to achieve a reduction of the remnants of the dragged-in activation solution. The palladium precipitated onto the bottom of the module, adsorbed on the module surfaces and accumulated in the filters. After 1 hour, the solution was discarded, the module rinsed with water and a new makeup of Neoganth™ Reducer P-WA bath was provided. The decomposition rate of the reducing agent (60 mbar floodbar pressure) in the solution in said module was investigated by a series of titrations over time. Subsequently, 2,2'-thiobis(ethan-1-ol) was added and the concentration stepwise increased from 10 to 50 to 100 mg/L. Similarly, decomposition rates were determined for all additive concentrations. Due to a high decomposition, dimethylamine borane was added in-between the experiments. The floodbar pressure was 60 mbar for 10 mg/L and 100 mg/L additive content, 60 mbar and 15 mbar for 50 mg/L additive. The dimethylamine borane decomposition rate was obtained as described above and at least 5 values were measured over 60 min for each concentration of the additive. The obtained values have been used to calculate the decomposition rate and its decrease for each additive concentration. The results are summarized in Table X.

TABLE X

Influence of the concentration of the additive on the decomposition rate of DMAB.

| # | Additive | concentration [mg/L] | k | Decrease of the decomposition rate |
|---|---|---|---|---|
| 1 | none | 0 | −0.1361 | 0% |
| 2 | HO-CH₂CH₂-S-CH₂CH₂-OH | 10 | −0.1006 | 26% |
| 3 | HO-CH₂CH₂-S-CH₂CH₂-OH | 50 | −0.0751 | 45% |
| 4 | HO-CH₂CH₂-S-CH₂CH₂-OH | 50* | −0.0772 | 43% |
| 5 | HO-CH₂CH₂-S-CH₂CH₂-OH | 100 | −0.0586 | 57% |

*floodbar pressure reduced to 15 mbar (otherwise 60 mbar)

It is obvious that the treatment solutions comprising a thioether as additive (entries #2 to #5, Table X) showed a significant decrease of the de-composition rate of the reducing agent, namely dimethylaminoborane, compared to a treatment solution which contained no additive (entry #1, Table X). The concentration of 50 mg/L allowed for a reduction of the decomposition rate of the reducing agent by 45% compared to a solution, which contained no additive at all. Without being bound by theory, it appears that (at least some of the) decomposition of the reducing agent is promoted or catalysed, probably due to the presence of a species of a metal, which is hampered or at least slowed by the additive in the treatment solution. This effect becomes more visible when higher amounts of said metals are present in the treatment solution.

Besides the investigation of decomposition rates, solder shock test coupons (IS410 form Isola, HR7 design, 1mm hole diameter) were processed using 2,2'-thiobis(ethan-1-ol) in concentrations of 0 mg/L, 10 mg/L and 50 mg/L, respectively (60 mbar floodbar pressure). During said treatment, the dimethylamine borane concentration in the solution of entry #5, Table VII, was in the area of 0.5 g/L. After electrolytical deposition of copper onto the substrate treated according to the process outlined in Table VII (40 µm thickness of copper obtained, 100 min duration of optional step (e), 2 A/dm²), the coupons were tested towards reliability by solder shock according to IPC TM-650 2.6.8, which is known in the art. Shocking was done six times at a temperature of 288° C. The tests evaluated the adhesion of the coupons copper inner layers between copper obtained in step (d) and electrolytically deposited copper of optional step (e) in the recessed structures under thermal stress conditions. 320 Interconnections were evaluated for each additive concentration and no interconnect defects (ICDs) were found. This demonstrated that the adhesion of the individual metal deposits obtained in step (d) and step (e) was not negatively affected by the presence of the mentioned thioether in the given concentration range.

The example showed that i) the thioether could successfully be used to decrease the decomposition rate of dimethylamine borane in a horizontal plating line and ii) that the presence of the thioether had no negative effect on the adhesion of the individual metal deposits obtained in step (d) and step (e) (copper to copper adhesion).

Other embodiments of the present invention will be apparent to those skilled in the art from a consideration of this specification or practice of the invention disclosed herein. It is intended that the specification and examples be considered as exemplary only, with the true scope of the invention being defined by the following claims only.

The invention claimed is:

1. A process for depositing a metal or metal alloy on at least one surface of a substrate comprising the steps of
    (a) providing a substrate;
    (b) treating the surface of said substrate with an activation solution comprising at least one source of metal ions selected from the group consisting of sources of palladium ions, sources of osmium ions, sources of iridium ions, sources of platinum ions, sources of copper ions, sources of gold ions and mixtures thereof such that at least one portion of said metal ions is being adsorbed on the surface of said substrate, wherein the temperature of the activation solution in the treating step (b) is in the range from 20° C. to 60° C.;
    (c) treating the surface of said substrate obtained from step (b) with a treatment solution comprising
        i) at least one additive independently selected from the group consisting of thiols, thioethers, disulphides and sulphur containing heterocycles, and
        ii) at least one reducing agent suitable to reduce the metal ions adsorbed on the surface of said substrate selected from the group consisting of boron based reducing agents, sources of hypophosphite ions, hydrazine and hydrazine derivatives, ascorbic acid, iso-ascorbic acid, sources of formaldehyde, glyoxylic acid, sources of glyoxylic acid, glycolic acid, formic acid, sugars, and salts of aforementioned acids; and wherein the concentration of the at least one reducing agent ranges from 0.1 to 500 mmol/L
    (d) treating the surface obtained from step (c) of said substrate with a metallizing solution comprising a solvent and at least one source of metal ions to be deposited such that a metal or metal alloy is deposited thereon; wherein:
        when the at least one additive independently selected from the group consisting of thiols, thioethers, disulphides and sulphur containing heterocycles comprises a thiol, the concentration of the thiol is in the range from 1 µg/L to 300 µg/L;
        when the at least one additive independently selected from the group consisting of thiols, thioethers, disulphides and sulphur containing heterocycles comprises a thioether, the concentration of the thioether is in the range from 0.05 mg/L to 20 mg/L;
        when the at least one additive independently selected from the group consisting of thiols, thioethers, disulphides and sulphur containing heterocycles comprises a disulphide, the concentration of the disulphide is in the range from 0.1 µg/L to 100 µg/L;
        when the at least one additive independently selected from the group consisting of thiols, thioethers, disulphides and sulphur containing heterocycles comprises a sulphur-containing heterocycle, the concentration of the sulphur-containing heterocycle is in the range from 0.1 µg/L to 20 mg/L;
        when the at least one additive independently selected from the group consisting of thiols, thioethers, disulphides and sulphur containing heterocycles comprises a sulphur-containing heterocycle comprising at least one thiol group, the concentration of the sulphur-containing heterocycle comprising at least one thiol group is in the range from 0.1 µg/L to 100 µg/L.

2. The process according to claim 1 characterised in that the at least one reducing agent is a boron based reducing agent selected from the group consisting of amino boranes, ammonia borane, borohydrides, borane and homologues thereof.

3. The process according to claim 1 characterised in that the metallizing solution is an electroless metallizing solution comprising said at least one source of metal ions, at least one complexing agents and at least one reducing agent.

4. The process according to claim 3 characterised in that the at least one source of metal ions in the metallizing solution is selected from the group consisting of sources of copper ions, of sources of nickel ions, of sources of cobalt ions and mixtures thereof.

5. The process according to claim 1 characterised in that the at least one surface of the substrate is selected from the group consisting of metallic surfaces, non-metallic surfaces and combinations thereof.

6. The process according to claim 1 characterised in that the substrate is selected from the group consisting of printed circuit boards, printed circuit foils, interposers, chip carriers, IC substrates, semiconductor wafers, circuit carriers, interconnect devices and precursors for any of the aforementioned.

7. The process according to claim 1 characterised in that the thiols are represented by the following formula (I)

        (I)

wherein R1 is independently selected from the group consisting of substituted and unsubstituted aliphatic groups, substituted and unsubstituted aryl groups and substituted and unsubstituted heteroaryl groups.

8. The process according to claim 7 characterised in that the thiols are selected from the group consisting of ethylthiol, 1-propylthiol, 2-propylthiol, 1-butylthiol, 2-butylthiol, 2-methylpropane-1-thiol, ethane-1,2-dithiol, propane-1,2-dithiol, propane-1,3-dithiol, butane-1,2-dithiol, butane-1,3-dithiol, butane-1,4-dithiol, butane-2,3-dithiol, 2-methylpropane-1,2-dithiol, 1H-benzo[d]imidazole-2-thiol, 1-methyl-1H-benzimidazole-2-thiol, 2-mercaptophenol, 4-mercaptophenol, thiosalicylic acid and 6-mercaptopyridine-3-carboxylic acid and the respective hydroxy and/or amino and/or carboxyl derivatives of the aforementioned.

9. The process according to claim 1 characterised in that the thioethers are represented by the following formula (II)

R2—S—R3     (II)

wherein R2 and R3 are independently from each other selected from the group consisting of substituted and unsubstituted aliphatic groups, substituted and unsubstituted aryl groups and substituted and unsubstituted heteroaryl groups.

10. The process according to claim 9 characterised in that the thioethers are selected from the group consisting of diethylsulphane, dipropylsulphane, dibutylsulphane, ethylproylsulphane, ethylbutylsulphane, propylbutylsulphane, 2 (methylthio)benzoic acid, 4,4'-thiodiphenol, and the respective the respective hydroxy and/or amino and/or carboxyl derivatives of the aforementioned.

11. The process according to claim 1 characterised in that the disulphides are represented by the following formula (III)

R4—S—S—R5     (III)

wherein R4 and R5 are independently from each other selected from the group consisting of substituted and unsubstituted aliphatic groups, substituted and unsubstituted aryl groups and, substituted and unsubstituted heteroaryl groups.

12. The process according to claim 11 characterised in that the disulphides are selected from the group consisting of cystamine, 2-hydroxyethyl disulphide, 3-hydroxypropyldisulphide, 4-hydroxybutyldisulphide, dithiodiglycolic acid, 3,3'-dithiodipropionic acid, 4,4'-dithiodibutyric acid, bis(2-am inophenyl) disulphide, bis(4-aminophenyl) disulphide, 2,2'-dithiodibenzoic acid, difurfuryl disulphide, D-penicillamine disulphide, 3,3'-dihydroxydiphenyl disulphide, methyl furfuryl disulphide, 1,2-bis(2,2-diethoxyethyl)disulphide, 2,2'-dithiodipyridine and 6,6'-dithiodinicotinic acid.

13. The process according to claim 1 characterised in that the sulphur containing heterocycles comprise
at least one ring-system which comprises carbon atoms, at least one sulphur atom and optionally at least one nitrogen atom,
wherein the total amount of said carbon, sulphur and nitrogen atoms in the at least one ring-system ranges from 3 to 13 atoms, preferably from 4 to 12, more preferably from 5 to 9; and wherein
the sulphur containing heterocycles are substituted or unsubstituted; and
the sulphur containing heterocycles are saturated or unsaturated, preferably aromatic.

14. The process according to claim 13 characterised in that the sulphur containing heterocycles are selected from the group consisting of unsubstituted and substituted thiophene, unsubstituted and substituted thiazole, unsubstituted and substituted thiopyran, unsubstituted and substituted benzothiazole, unsubstituted and substituted thiabendazole, unsubstituted and substituted benzothiazole, unsubstituted and substituted thiazole, unsubstituted and substituted thiophene, unsubstituted and substituted tetrahydrothiophene, unsubstituted and substituted thiazolidine, unsubstituted and substituted 1,3-Dithiolane, unsubstituted and substituted 1,4-dithiane, unsubstituted and substituted 1,3-dithiane, unsubstituted and substituted thiomorpholine, unsubstituted and substituted tetrahydrothiopyran.

15. The process according to claim 1 characterised in that the treatment solution is free of intentionally added reducible metal ions.

16. The process according to claim 1 characterised in that the at least one additive is a thioether.

17. The process according to claim 1 wherein said activation solution comprising at least one source of metals is selected from the group consisting of sources of palladium ions, sources of platinum ions, and sources of copper ions.

18. The process according to claim 1 wherein total concentration of the metal ions in the activation solution ranges from 1 to 500 mg/kg.

19. The process according to claim 1 wherein said activation solution has a neutral to alkaline pH.

20. The process according to claim 1 characterised in that the concentration of the at least one reducing agent ranges from 0.1 to 100 mmol/L.

* * * * *